US009445501B2

United States Patent
Nishio et al.

(10) Patent No.: US 9,445,501 B2
(45) Date of Patent: Sep. 13, 2016

(54) ELECTRICALLY CONDUCTIVE COMPOSITION, ELECTRICALLY CONDUCTIVE FILM USING THE COMPOSITION AND A METHOD OF PRODUCING THE SAME

(71) Applicant: FUJIFILM Corporation, Minato-ku, Tokyo (JP)

(72) Inventors: Ryo Nishio, Ashigarakami-gun (JP); Toshiaki Aoai, Ashigarakami-gun (JP); Naoyuki Hayashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 245 days.

(21) Appl. No.: 14/034,676

(22) Filed: Sep. 24, 2013

(65) Prior Publication Data

US 2014/0020939 A1    Jan. 23, 2014

Related U.S. Application Data

(63) Continuation of application No. PCT/JP2012/057763, filed on Mar. 26, 2012.

(30) Foreign Application Priority Data

Mar. 28, 2011  (JP) ................................. 2011-070392
May 11, 2011  (JP) ................................. 2011-105912

(51) Int. Cl.
| | | |
|---|---|---|
| H01B 1/00 | (2006.01) | |
| B05D 5/12 | (2006.01) | |
| H05K 1/09 | (2006.01) | |
| C08J 5/18 | (2006.01) | |
| H01B 1/12 | (2006.01) | |
| C08G 61/02 | (2006.01) | |
| C08G 61/10 | (2006.01) | |
| C08G 61/12 | (2006.01) | |
| C09D 165/00 | (2006.01) | |
| C08L 65/00 | (2006.01) | |
| C08K 5/03 | (2006.01) | |
| C08K 5/19 | (2006.01) | |
| C08K 5/375 | (2006.01) | |
| H01L 51/00 | (2006.01) | |

(52) U.S. Cl.
CPC .............. *H05K 1/09* (2013.01); *C08G 61/02* (2013.01); *C08G 61/10* (2013.01); *C08G 61/126* (2013.01); *C08J 5/18* (2013.01); *C08K 5/03* (2013.01); *C08K 5/19* (2013.01); *C08K 5/375* (2013.01); *C08L 65/00* (2013.01); *C09D 165/00* (2013.01); *H01B 1/124* (2013.01); *H01B 1/127* (2013.01); *H01L 51/0036* (2013.01); *C08G 2261/312* (2013.01); *C08G 2261/3223* (2013.01); *C08G 2261/3241* (2013.01); *C08G 2261/3243* (2013.01); *C08G 2261/3246* (2013.01); *C08G 2261/3422* (2013.01); *C08G 2261/514* (2013.01); *C08G 2261/76* (2013.01); *C08G 2261/792* (2013.01); *C08J 2300/12* (2013.01); *C08J 2365/00* (2013.01); *Y10T 428/31533* (2015.04)

(58) Field of Classification Search
CPC ..................... H01B 1/00; H01B 1/124–1/128; H01B 13/00; B05D 5/12; C08G 61/00; B32B 27/00
See application file for complete search history.

(56) References Cited

U.S. PATENT DOCUMENTS

| | | | |
|---|---|---|---|
| 3,625,684 A | 12/1971 | Poot et al. | |
| 5,198,153 A | 3/1993 | Angelopoulos et al. | |
| 5,198,326 A | 3/1993 | Hashimoto et al. | |
| 5,202,061 A * | 4/1993 | Angelopoulos et al. | 252/500 |
| 2006/0076540 A1 | 4/2006 | Zama et al. | |
| 2008/0050534 A1* | 2/2008 | Louwet et al. | 427/508 |
| 2009/0256117 A1* | 10/2009 | Seshadri et al. | 252/500 |
| 2010/0294997 A1* | 11/2010 | Yoshida et al. | 252/500 |
| 2014/0060602 A1* | 3/2014 | Aoai et al. | 136/205 |

FOREIGN PATENT DOCUMENTS

| | | |
|---|---|---|
| EP | 0399299 A2 | 11/1990 |
| EP | 1725079 A1 | 11/2006 |
| JP | 60-97571 A | 5/1985 |
| JP | 62267321 A | 11/1987 |
| JP | 2586692 B2 | 3/1997 |
| JP | 2657956 B2 | 9/1997 |
| JP | 2003022938 A | 1/2003 |
| JP | 2003-213147 A | 7/2003 |
| JP | 2003243028 A | 8/2003 |
| JP | 2004-529233 A | 9/2004 |
| JP | 2006-182958 A | 7/2006 |
| JP | 2010-106245 A | 5/2010 |
| JP | 2010-202704 A | 9/2010 |
| WO | 2004/014987 A1 | 2/2004 |

OTHER PUBLICATIONS

Crivello "The discovery and development of onium salt cationic photoinitiators", Journal Polymer Science: Part A: Polymer Chemistry, vol. 37, 4241-4254 (1999).*

(Continued)

*Primary Examiner* — Mark Kopec
(74) *Attorney, Agent, or Firm* — Sughrue Mion, PLLC

(57) ABSTRACT

An electrically conductive composition, containing an electrically conductive polymer, and an onium salt compound as a dopant to the electrically conductive polymer, an electrically conductive film formed by shaping the composition and a method of producing the electrically conductive film.

15 Claims, No Drawings

(56) References Cited

OTHER PUBLICATIONS

Angelopoulos et al "In-situ radiation unduced doping", Mol. Cryst. Liq. Cryst. 1990, vol. 189, pp. 221-225.*
Katsumi Yoshino et al., "Optical Induced Insolubilization of Soluble Conducting Polymer by Doping and Its Application for Recording", Japanese Journal of Applied Physics, Apr. 1991, pp. L657-L659, vol. 30, No. 4A.
International Search Report for PCT/JP2012/057763 dated Jun. 26, 2012.
Communication dated Jul. 22, 2015 from the European Patent Office issued in corresponding Application No. 12765735.1.

* cited by examiner

ELECTRICALLY CONDUCTIVE COMPOSITION, ELECTRICALLY CONDUCTIVE FILM USING THE COMPOSITION AND A METHOD OF PRODUCING THE SAME

FIELD OF THE INVENTION

The present invention relates to an electrically conductive composition, an electrically conductive film using the composition and a method of producing the same.

BACKGROUND OF THE INVENTION

In recent years, progress in an electronics field has successively led to research and development of new electronics materials. A polymer compound having electrical conduction properties is also one of them, and draws attention as a new electrically conductive material in place of a conventional metallic material.

An electrically conductive material using a polymer has advantages of allowing production in a simpler technique and in a relatively less expensive manner in comparison with the metallic material, and is expected for practical use.

In a case of the metallic material, generally, a film of the metallic material is formed by adhering or depositing the material on a substrate by a vapor phase process such as a vacuum deposition process and a sputtering process, to produce the electrically conductive material. However, this method requires a large amount of cost for a production apparatus or the like, and is unsuitable for large scale production. Moreover, research has recently been conducted for shifting substrate materials from glass to a plastic in order to meet a desire for achieving light-weight or flexible electrical equipment. However, in view of heat resistance, glass is generally used for the substrate in the vapor phase process. Use of a plastic substrate has some problems such as insufficient heat resistance, a decrease in adhesion of a formed coating film to the substrate, resulting in being easily detached, or the like.

In contrast, an electrically conductive material using an electrically conductive polymer essentially requires neither a high temperature nor vacuum conditions, and therefore a production step therefor is simple, and thus production cost can be suppressed. A material such as the plastic can also be utilized as the substrate, and therefore can be achieved light-weight or flexible equipment, and also significantly improved strength and impact resistance of the equipment. Moreover, film formation can be made by a coating method such as spin coating, and therefore the electrically conductive material is also suitable for production of a large area film or the like.

In view of such advantages, it is suggested that the electrically conductive polymer is applied to various kinds of uses, such as a transparent electrode for a liquid crystal display or a solar cell, an electrode material for a condenser, a capacitor, or a secondary cell, an antistatic material, an organic semiconductor material used for an organic electroluminescence (organic EL) device or an organic transistor, and a material for electronic circuit patterning, and research for practical use has started.

Specific examples of the electrically conductive polymers that are currently used include a polymer compound having an electron conjugated system in a molecule, such as polyacethylene, poly-p-phenylene, polypyrrole, polyaniline, and polythiophene. In order to improve an electrical conductivity, doping of a carrier into these polymers is carried out, and as a dopant, a halogen atom, protonic acid, Lewis acid, a metal halide, or the like is known. Further, an improvement in suitability for various kinds of uses is also made by adding any other component to the electrically conductive polymer. For example, Patent literature 1 proposes an electrically conductive resin-formable composition in which a photo-curing monomer and a curing accelerator are formulated with an electrically conductive polymer, and describes that the monomer is subjected to a curing reaction to allow an improvement in mechanical strength and adhesion to a substrate, and that selective light irradiation is applied to allow use as a pattern-forming material. Patent literature 2 proposes an electrically conductive coating composition in which a thermal crosslinking agent and a crosslinking accelerator are formulated with a composite formed of an electrically conductive polymer and a dopant, and describes that the composition has low-temperature curability to allow application to a substrate having low heat resistant, and that the composition can be used as an antistatic layer for a packaging material of an electronic component, or the like. Moreover, Patent literature 3 proposes a pattern-forming material in which an electrically conductive polymer is used as a matrix polymer, and an acid-degradable resin and a photoacid generator are formulated therewith.

Among these prior literatures, the electrically conductive material described in Patent literature 1 or 2 is proposed for the purpose of improving adhesion of a resin film to the substrate, heat resistance, or the like by the curing reaction of the resin. However, Patent literature 1 and 2 do not describe improvement of the electrical conductivity. Moreover, Patent literature 3 discloses the use of the photoacid generator for the purpose of forming a fine pattern on the polymer resin using a charged beam. However, Patent literature 3 does not aim at an improvement in the electrical conductivity by using the photoacid generator.

CITATION LIST

Patent Literatures

Patent Literature 1: JP-A-2010-202704 ("JP-A" means unexamined published Japanese patent application)
Patent Literature 2: JP-A-2010-106245
Patent Literature 3: Japanese Patent No. 2586692

SUMMARY OF THE INVENTION

Problems that the Invention is to Solve

The present invention is contemplated for providing an electrically conductive composition having an improved electrical conductivity of an electrically conductive polymer, and an excellent coating property, and further an excellent film-forming property. The present invention is also contemplated for providing an electrically conductive film using the composition and having a good film quality. The present invention is also contemplated for providing a method of producing the same.

Means to Solve the Problem

In view of the above, the present inventors made extensive studies. Then, the present inventors found that, when an onium salt compound is mixed as a dopant with an electrically conductive polymer, the onium salt compound is uniformly dispersed or dissolved into the composition to cause no aggregation, no precipitation, no sedimentation, or the like, that a component or a structure included in the composition to cause interfacial resistance is reduced, and that uniformity of the composition is improved, and as a result, that an electrically conductive composition having good coating property that allows an improvement in electrical conductivity by doping treatment during film formation, and good doping properties can be obtained. The present invention was completed based on such findings.

The present inventors conducted research in various ways, and when a conventional dopant such as protonic acid, Lewis acid, and a metal halide was used, the electrically conductive polymer was cationized by addition of such a dopant to cause aggregation, precipitation, sedimentation, or the like, and solubility decreased, and as a result, the coating property deteriorated. Moreover, when a halogen was used as a dopant, no aggregation or the like was caused, but the electrical conductivity over time significantly decreased by volatilization of the dopant. Based on these findings, the present inventors further conducted research, and found a new doping technique using the onium salt compound as the dopant in place of a conventional-type dopant, and an effect thereof. The doping technique was adopted in the present invention. The present invention is not the inventions described in the above-described Patent literatures 1 to 3.

Further, according to the above-described Patent literatures 1 to 3, a predetermined amount of degradable polymer or curing monomer is formulated as an essential component in the electrically conductive material. The present inventors found that these components decrease the electrical conductivity of the material. When the degradable polymer is contained, a low-molecular-weight component that does not contribute to the electrical conductivity increases by degradation to cause resistance, and the electrical conductivity decrease as a whole. Moreover, when a curable monomer or a crosslinking agent is contained, a site to be connected by a polymerizable/crosslinkable group becomes insulative. Therefore, the electrical conductivity decrease, as well. Furthermore, a molecular weight of the degradable polymer, the curing monomer, or the like is significantly changed before and after degradation or a polymerization reaction. Due to such change of the molecular weight, volume shrinkage or a density distribution is generated, which causes a crack, a void, or a grain boundary.

According to the present invention, there is provided the following means:

(1) An electrically conductive composition, comprising an electrically conductive polymer, and an onium salt compound as a dopant to the electrically conductive polymer.
(2) The electrically conductive composition according to the item (1), comprising the onium salt compound in an amount of 10 parts by mass or more based on 100 parts by mass of the electrically conductive polymer.
(3) The electrically conductive composition according to the item (1) or (2), wherein the electrically conductive polymer and the onium salt compound are uniformly dispersed in the composition.
(4) The electrically conductive composition according to any one of the items (1) to (3), wherein the onium salt compound is a compound that generates acid by provision of heat or irradiation with active energy rays.
(5) The electrically conductive composition according to any one of the items (1) to (4), wherein the onium salt compound is at least one compound selected from compounds represented by Formulae (I) to (V),

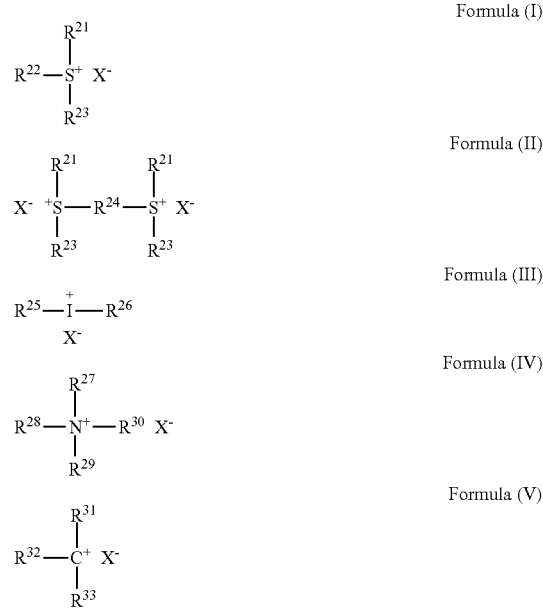

wherein in Formulae (I) to (V), $R^{21}$ to $R^{23}$, $R^{25}$ to $R^{26}$, and $R^{31}$ to $R^{33}$ each independently represent an alkyl group, an aralkyl group, an aryl group, or an aromatic heterocyclic group; $R^{27}$ to $R^{30}$ each independently represent a hydrogen atom, an alkyl group, an aralkyl group, an aryl group, an aromatic heterocyclic group, an alkoxy group, or an aryloxy group; $R^{24}$ represents an alkylene group or an arylene group; $X^-$ represents an anion of strong acid; and two of arbitrary groups selected from $R^{21}$ to $R^{23}$, $R^{25}$ to $R^{26}$, and $R^{31}$ to $R^{33}$ in an identical formula may be bonded with each other to form an aliphatic ring, an aromatic ring, or a heterocyclic ring.

(6) The electrically conductive composition according to any one of the items (1) to (5), wherein the onium salt compound is a sulfonium salt compound represented by Formula (I) and/or (II), $R^{21}$ to $R^{23}$ are a phenyl group, or a chlorine-substituted phenyl group, and $X^-$ is an anion of alkyl or aryl borate.
(7) The electrically conductive composition according to any one of the items (1) to (6), wherein the moisture content of the electrically conductive composition is 0.01% by mass or more to 15% by mass or less.
(8) The electrically conductive composition according to any one of the items (1) to (7), wherein the electrically conductive polymer is a conjugated polymer having a repeating unit derived from at least one monomer selected from the group consisting of a thiophene-based compound, a pyrrole-based compound, an aniline-based compound, an acetylene-based compound, a p-phenylene-based compound, a p-phenylenevinylene-based compound, and a p-phenyleneethynylene-based compound, and a derivative thereof.
(9) The electrically conductive composition according to any one of the items (1) to (8), wherein the electrically conductive polymer is a conjugated polymer having at least a repeating unit derived from a thiophene compound.
(10) The electrically conductive composition according to any one of the items (1) to (9), wherein the electrically conductive polymer has at least one repeating unit selected from repeating units represented by Formulae (1) to (5),

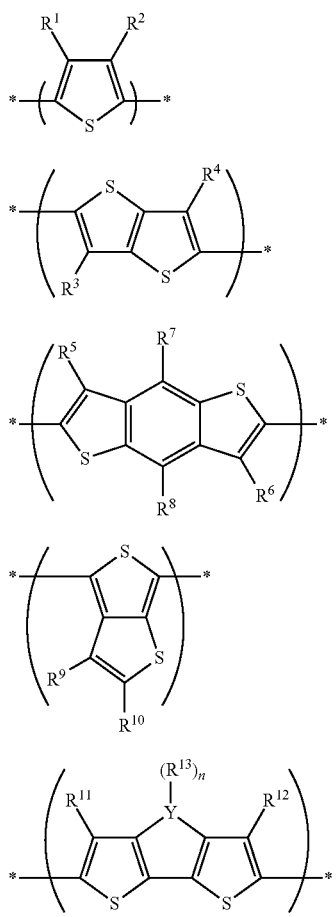

wherein in Formulae (1) to (5), $R^1$ to $R^{13}$ each independently represent a hydrogen atom, a halogen atom, an alkyl group, an alkoxy group, a perfluoroalkyl group, a perfluoroalkoxy group, an amino group, an alkylthio group, a polyalkyleneoxy group, an acyloxy group, or an alkyloxycarbonyl group; Y represents a carbon atom, a nitrogen atom, or a silicon atom; and n represents an integer of 1 or 2.

(11) The electrically conductive composition according to any one of the items (1) to (10), further comprising a solvent.

(12) An electrically conductive film, formed by shaping the electrically conductive composition according to any one of the items (1) to (11), and then providing the shaped product with heat or active energy rays.

(13) An electrically conductive laminate, formed by coating (applying) the electrically conductive composition according to any one of the items (1) to (11) onto a substrate, and then providing the coated product with heat or active energy rays.

(14) The electrically conductive laminate according to the item (13), wherein the substrate is a resin film.

(15) The electrically conductive laminate according to the item (13) or (14), further having an electrode.

(16) An electrically conductive article, using any one of the electrically conductive composition according to any one of the items (1) to (11), the electrically conductive film according to the item (12), and the electrically conductive laminate according to any one of the items (13) to (15).

(17) A method of producing an electrically conductive film, comprising a step of shaping the electrically conductive composition according to any one of the items (1) to (11), and a step of heating the shaped product or irradiating the shaped product with active energy rays.

(18) The method of producing an electrically conductive composition according to the item (17), further comprising a step of treating the shaped product so as to have the moisture content in an amount of 0.01% by mass or more to 15% by mass or less.

(19) The method of producing an electrically conductive film according to the item (17) or (18), wherein the shaping step is a step of coating (applying) the electrically conductive composition onto a substrate.

Effects of the Invention

An electrically conductive composition of the present invention has excellent electrical conductivity, and is dissolved into a solvent to allow film formation, and has excellent coating property onto a substrate, thereby allowing suitable use in production of an electrically conductive film, an electrically conductive layer, or the like. The electrically conductive film produced using the composition of the present invention has high electrical conductivity and a good film quality, and can be utilized in a wide range of uses as an electrically conductive material. Specifically, the electrically conductive composition and the electrically conductive film of the present invention are useful as a transparent electrode used for various kinds of display devices typified by a liquid crystal display, or a solar cell, an electrically conductive material used for a condenser, a capacitor, or a secondary cell, or an organic semiconductor material for a photoelectric conversion device, a thermoelectric conversion device, an organic FET, or the like.

Other and further features and advantages of the invention will appear more fully from the following description.

MODE FOR CARRYING OUT THE INVENTION

An electrically conductive composition of the present invention contains, as a component contributing to the electrical conductivity, an electrically conductive polymer and an onium salt compound. The onium salt compound functions as a dopant to the electrically conductive polymer.

In the electrically conductive composition of the present invention, each component is uniformly dispersed or dissolved in the composition to exhibit good coating property. Therefore, the composition can easily form a film by coating, and a formed coating film has high electrical conductivity and a good film quality.

Following, the present invention will be described in detail.

[Electrically Conductive Polymer]

The electrically conductive polymer used in the present invention may be any compound that exhibits the electrical conductivity by doping with the onium salt compound according to a preparation method as described later. Moreover, the electrically conductive polymer is not necessarily a high-molecular-weight compound, but rather may be an oligomer compound.

As the electrically conductive polymer, specifically, a polymer compound having a conjugated molecular structure can be used. In the present specification, the polymer having the conjugated molecular structure means a polymer having a structure in which a single bond and a double bond are alternately connected in a carbon-to-carbon bond on a main chain of the polymer.

Specific examples of such conjugated polymers include conjugated polymers having a repeating unit derived from a monomer selected form a thiophene-based compound, a pyrrole-based compound, an aniline-based compound, an acetylene-based compound, a p-phenylene-based compound, a p-phenylenevinylene-based compound, a p-phenyleneethynylene-based compound, a p-fluorenylenevinylene-based compound, a polyacene-based compound, a polyphenanthrene-based compound, a metal-phthalocyanine-based compound, a p-xylylene-based compound, a vinylenesulfide-based compound, a m-phenylene-based compound, a naphthalenevinylene-based compound, a p-phenyleneoxide-based compound, a phenylenesulfide-based compound, a furan-based compound, a selenophene-based compound, an azo-based compound, a metal complex-based compound, and a derivative formed by introducing a substituent into each of these compounds.

The substituent to be introduced into the above-described derivative is not particularly limited, but in consideration of compatibility with other components, a kind of medium that can be used, or the like, it is preferable to appropriate select a group that can improve dispersibility or solubility of the electrically conductive polymer or the onium salt compound in the composition, and to introduce thereinto.

In the present invention, when a term "xxx group" is described with regard to the substituent, the xxx group may have an arbitrary substituent therein. Moreover, in the present invention, when a plurality of groups represented by an identical symbol are present, the groups may be the same or different with each other. Moreover, in the present invention, a group that can take a linear, branched, or cyclic structure, such as an alkyl group and an alkylene group, may have any structure.

When an organic solvent is used as the medium, preferable examples of the substituent include a linear, branched, or cyclic alkyl group, alkoxy group, or thioalkyl group, and also alkoxyalkyleneoxy group, alkoxyalkyleneoxyalkyl group, crown ether group, aryl group. These groups may further have a substituent. The number of carbon atoms of the substituent is not particularly limited, but is preferably 1 to 12, and more preferably, 4 to 12. A long-chain alkyl group, alkoxy group, thioalkyl group, alkoxyalkyleneoxy group, or alkoxyalkyleneoxyalkyl group having 6 to 12 carbon atoms is particularly preferred.

When an aqueous medium is used, a hydrophilic group such as a carboxylic acid group, a sulfonate group, a hydroxyl group, and a phosphate group is preferably further introduced into each monomer terminal or the abode-described substituent.

In addition thereto, a dialkylamino group, a monoalkylamino group, an amino group, a carboxyl group, an ester group, an amide group, a carbamate group, a nitro group, a cyano group, an isocyanate group, an isocyano group, a halogen atom, a perfluoroalkyl group, a perfluoroalkoxy group, or the like can be introduced as the substituent, and such introduction is preferred.

The number of substituents that can be introduced is not particularly limited, but in consideration of the dispersibility, the compatibility, the electrical conductivity, or the like of the electrically conductive polymer, one or a plurality of substituents can be introduced as appropriate.

Specific examples of the conjugated polymers having repeating units derived from the thiophene-based compounds and the derivatives thereof include polythiophene, a conjugated polymer including a repeating unit derived from a monomer having a substituent introduced into a thiophene ring, and a conjugated polymer including a repeating unit derived from a monomer having a condensed polycyclic structure including a thiophene ring.

Specific examples of the conjugated polymers including the repeating units derived from the monomers having the substituents introduced into the thiophene rings include poly-alkyl-substituted thiophenes such as poly-3-methylthiophene, poly-3-butylthiophene, poly-3-hexylthiophene, poly-3-cyclohexylthiophene, poly-3-(2'-ethylhexyl)thiophene, poly-3-octylthiophene, poly-3-dodecylthiophene, poly-3-(2'-methoxyethoxy)methylthiophene, and poly-3-(methoxyethoxyethoxy)methylthiophene; poly-alkoxy-substituted thiophenes such as poly-3-methoxythiophene, poly-3-ethoxythiophene, poly-3-hexyloxythiophene, poly-3-cyclohexyloxythiophene, poly-3-(2'-ethylhexyloxy)thiophene, poly-3-dodecyloxythiophene, poly-3-methoxy(diethyleneoxy)thiophene, poly-3-methoxy(triethyleneoxy)thiophene, and poly-(3,4-ethylenedioxythiophene); poly-3-alkoxy-substituted-4-alkyl-substituted thiophenes such as poly-3-methoxy-4-methylthiophene, poly-3-hexyloxy-4-methylthiophene, and poly-3-dodecyloxy-4-methylthiophene; and poly-3-thioalkylthiophenes such as poly-3-thiohexylthiophene, poly-3-thiooctylthiophene, and poly-3-thiododecylthiophene.

Among these, poly-3-alkylthiophenes or poly-3-alkoxythiophenes are preferred. With regard to polythiophene having a substituent in 3-position, anisotropy arises depending on a bonding direction in 2- or 5-position of a thiophene ring. In polymerization of 3-substituted thiophene, a mixture is produced, including one in which the thiophene rings are bonded in 2-positions with each other (HH coupling: head-to-head), one in which the thiophene rings are bonded in 2-position and 5-position (HT coupling: head-to-tail), or one in which the thiophene rings are bonded in 5-positions with each other (TT coupling: tail-to-tail). A larger ratio of the one in which the thiophene rings are bonded in 2-position and the 5-position (HT coupling) is preferred in view of further improved planarity of a polymer main chain to further easily form a π-π stacking structure between the polymers and to further facilitate transfer of electric charges. Ratios of these bonding patterns can be measured by H-NMR. In the polymer, a ratio of the HT coupling in which the thiophene rings are bonded in 2-position and 5-position is preferably 50% by mass or more, more preferably 70% by mass or more, and particularly preferably 90% by mass or more.

More specifically, as the conjugated polymer including the repeating unit derived from the monomer having the substituent introduced into the thiophene ring, and the conjugated polymer including the repeating unit derived from the monomer having the condensed polycyclic structure including the thiophene ring, the following compounds can be exemplified. In the following formulae, n represents an integer of 10 or more.

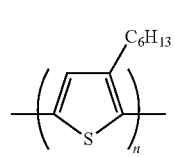

A-1

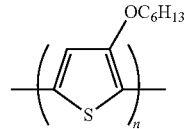

A-2

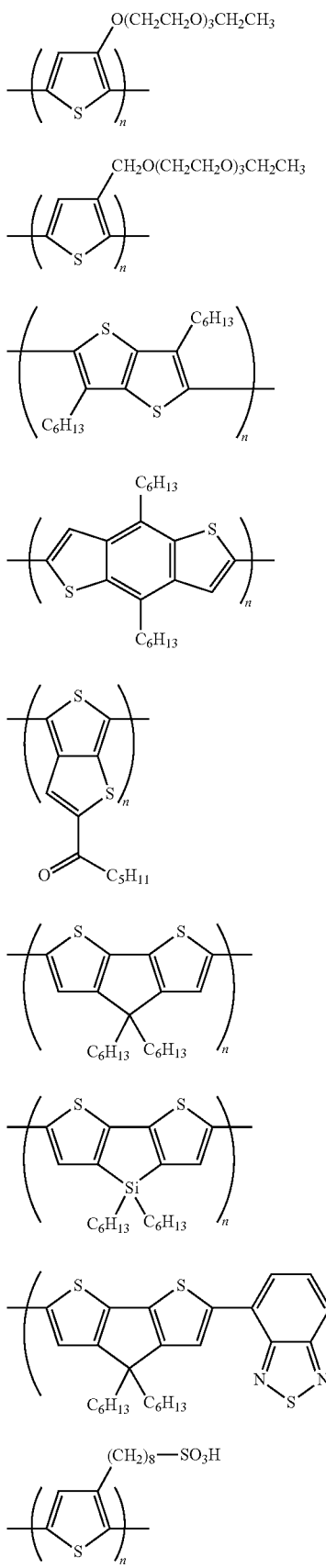
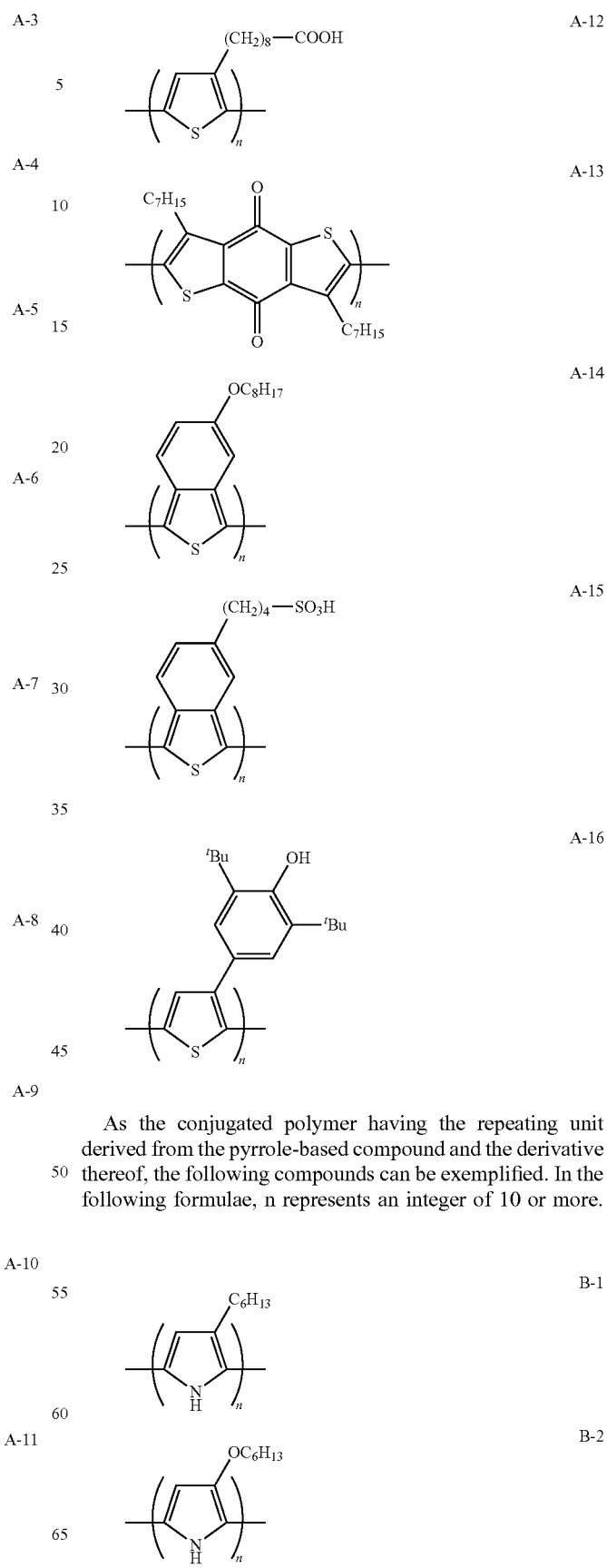
As the conjugated polymer having the repeating unit derived from the pyrrole-based compound and the derivative thereof, the following compounds can be exemplified. In the following formulae, n represents an integer of 10 or more.

-continued
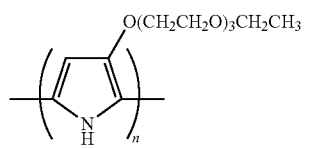
B-3
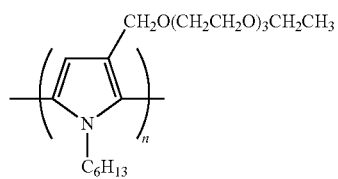
B-4
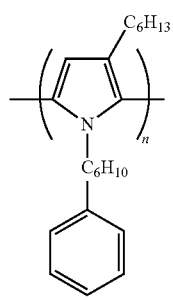
B-5
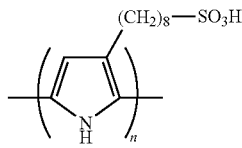
B-6
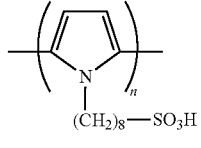
B-7
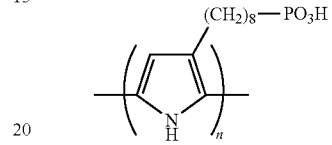
B-8
As the conjugated polymer having the repeating unit derived from the aniline-based compound and the derivative thereof, the following compounds can be exemplified. In the following formulae, n represents an integer of 10 or more.
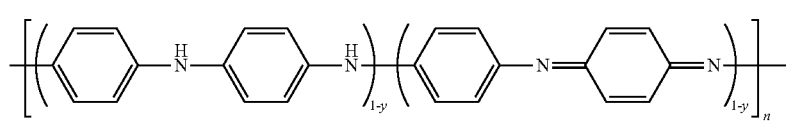
C-1
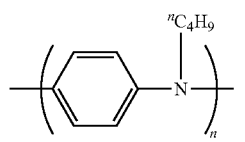
C-2
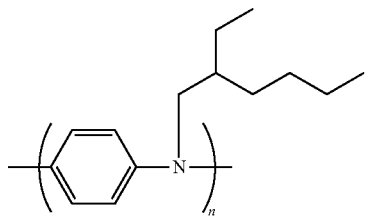
C-3
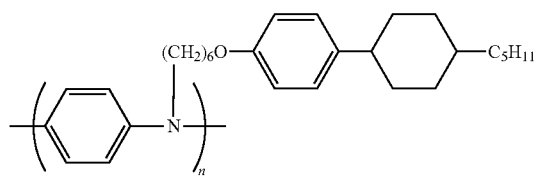
C-4
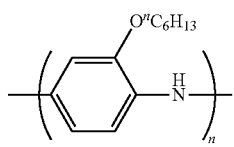
C-5
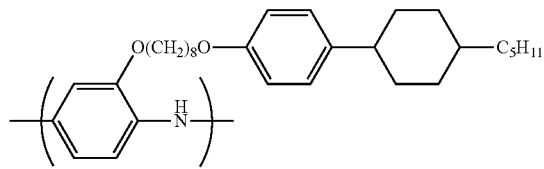
C-6
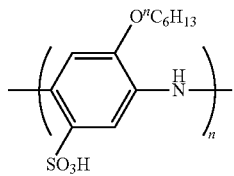
C-7
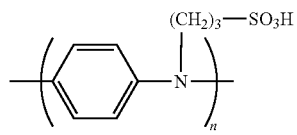
C-8

As the conjugated polymer having the repeating unit derived from the acetylene-based compound and the derivative thereof, the following compounds can be exemplified. In the following formulae, n represents an integer of 10 or more.

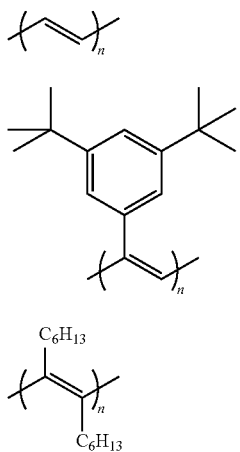

D-1

D-2

D-3

As the conjugated polymer having the repeating unit derived from the p-phenylene-based compound and the derivative thereof, the following compounds can be exemplified. In the following formulae, n represents an integer of 10 or more.

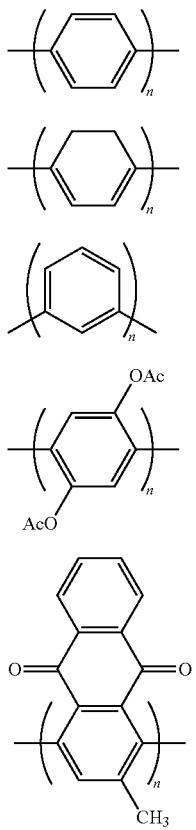

E-1

E-2

E-3

E-4

E-5

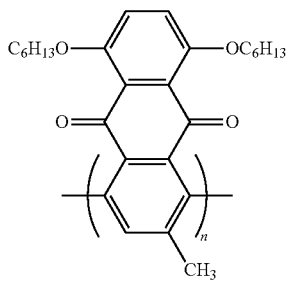

E-6

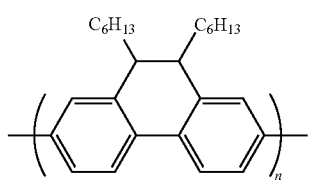

E-7

As the conjugated polymer having the repeating unit derived from the p-phenylenevinylene-based compound and the derivative thereof, the following compounds can be exemplified. In the following formulae, n represents an integer of 10 or more.

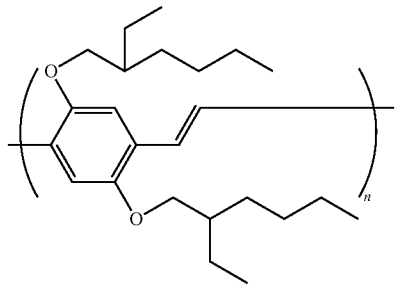

F-1

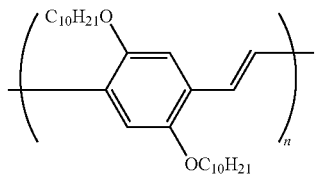

F-2

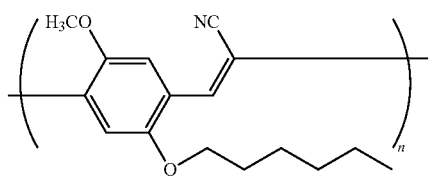

F-3

As the conjugated polymer having the repeating unit derived from the p-phenyleneethynylene-based compound and the derivative thereof, the following compounds can be exemplified. In the following formulae, n represents an integer of 10 or more.

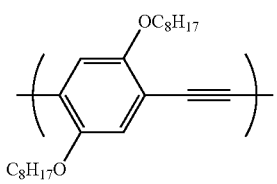
G-1
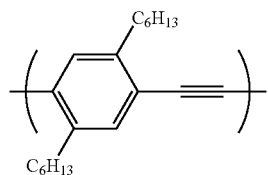
G-2
As a conjugated polymer having a repeating unit derived from a compound other than the above-described compounds and a derivative thereof, the following compounds can be exemplified. In the following formulae, n represents an integer of 10 or more.
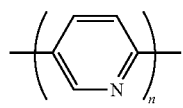
H-1
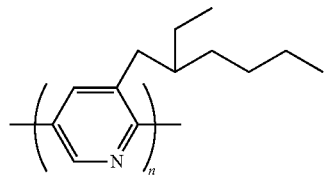
H-2
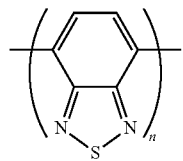
H-3
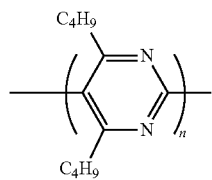
H-4
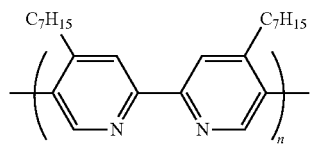
H-5
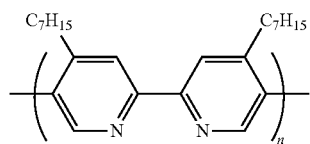
H-6
-continued
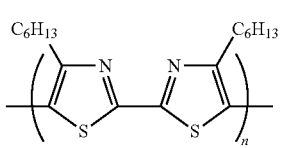
H-7
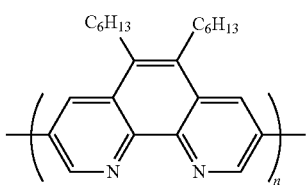
H-8
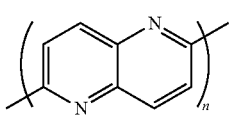
H-9
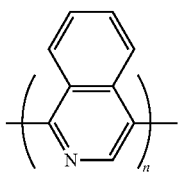
H-10
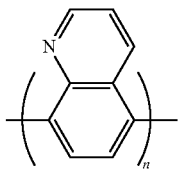
H-11
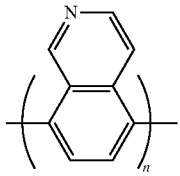
H-12
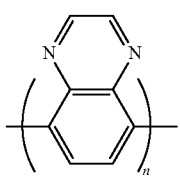
H-13
H-14
H-15
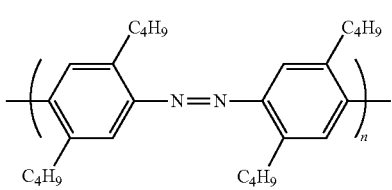
H-16

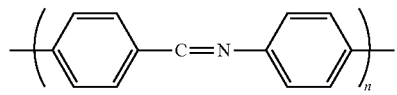

Among the above-described conjugated polymers, a linear conjugated polymer is preferably used. Such a linear conjugated polymer can be obtained, for example, in a case of the polythiophene-based polymer or the polypyrrole-based polymer, by bonding of the thiophene rings or pyrrole rings of each monomer in 2-position and 5-position, respectively. In a case of the poly-p-phenylene-based polymer, the poly-p-phenylenevinylene-based polymer, or the poly-p-phenyleneethynylene-based polymer, such a linear conjugated polymer can be obtained by bonding of the phenylene groups of each monomer in a para position (1-position and 4-position).

The electrically conductive polymer used in the present invention may have the above-mentioned repeating units (hereinafter, a monomer giving this repeating unit is also referred to as "first monomer (group of first monomers)") alone in one kind or in combination with two or more kinds. Moreover, the electrically conductive polymer may simultaneously have a repeating unit derived from a monomer having any other structure (hereinafter, also referred to as "second monomer"), in addition to the repeating unit derived from the first monomer. In a case of a polymer formed of a plurality of kinds of repeating units, the polymer may be a block copolymer, a random copolymer, or a graft polymer.

Specific examples of the second monomers having other structures used in combination with the above-described first monomer include a compound having a fluorenylene group, a carbazole group, a dibenzo[b,d]silole group, a thieno[3,2-b]thiophene group, a thieno[2,3-c]thiophene group, a benzo[1,2-b;4,5-b']dithiophene group, a cyclopenta[2,1-b;3,4-b']dithiophene group, a pyrrolo[3,4-c]pyrrole-1,4(2H,5H)-dione group, a benzo[2,1,3]thiadiazole-4,8-diyl group, an azo group, a 1,4-phenylene group, a 5H-dibenzo[b,d]silole group, a thiazole group, an imidazole group, a pyrrolo[3,4-c]pyrrole-1,4(2H,5H)-dione group, an oxadiazole group, a thiadiazole group, or a triazole group, and a derivative formed by further introducing a substituent into each of these compounds. Specific examples of the substituents to be introduced thereinto include ones similar to the above-mentioned substituents.

The electrically conductive polymer used in the present invention has the repeating units derived from one kind or a plurality of kinds of monomers selected from the group of first monomers in an amount of preferably 50% by mass or more, and more preferably 70% by mass or more, in total, in the electrically conductive polymer. The electrically conductive polymer further preferably consists of the repeating units derived from one kind or a plurality of kinds of monomers selected from the group of the first monomers. The electrically conductive polymer is particularly preferably a conjugated polymer consisting of a single repeating unit derived from a monomer selected from the group of the first monomers.

Among the groups of the first monomers, a polythiophene-based polymer including a repeating unit derived from a thiophene-based compound and/or a derivative thereof is preferably used. A polythiophene-based polymer having the thiophene rings or a thiophene ring-including condensed aromatic ring structure as represented by the structural formulae (1) to (5) below as a repeating unit, is particularly preferred.

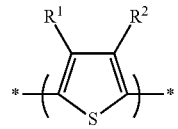

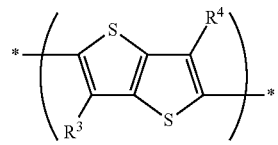

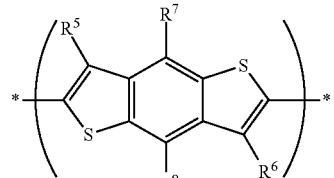

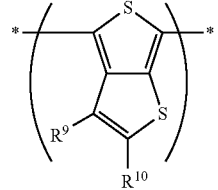

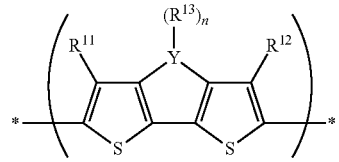

In formulae (1) to (5), $R^1$ to $R^{13}$ each independently represent a hydrogen atom, a halogen atom, an alkyl group, an alkoxy group, a perfluoroalkyl group, a perfluoroalkoxy group, an amino group, an alkylthio group, a polyalkyleneoxy group, an acyloxy group, or an alkyloxycarbonyl group; Y represents a carbon atom, a nitrogen atom, or a silicon atom; n represents an integer of 1 or 2; and a symbol "*" represents a connection site of each repeating unit.

In $R^1$ to $R^{13}$, specific examples of the halogen atoms include a fluorine, chlorine, bromine, or iodine atom, and fluorine or chlorine is preferred.

An alkyl group includes a linear, branched, or cyclic alkyl group, and an alkyl group having 1 to 14 carbon atoms is preferred. Specific examples include a methyl group, an ethyl group, a n-propyl group, an i-propyl group, a n-butyl group, a t-butyl group, a s-butyl group, a n-pentyl group, a t-amyl group, a n-hexyl group, a 2-ethylhexyl group, an octyl group, a nonyl group, a decyl group, a dodecyl group, and tetradecyl.

As an alkoxy group, an alkoxy group having 1 to 14 carbon atoms is preferred. Specific examples include a methoxy group, an ethoxy group, a n-propyloxy group, an i-propyloxy group, a n-butoxy group, a t-butoxy group, a s-butoxy group, a n-pentyloxy group, a t-amyloxy group, a n-hexyloxy group, a 2-ethylhexyloxy group, an octyloxy group, a nonyloxy group, a decyloxy group, a dodecyloxy group, and tetradecyloxy.

As a perfluoroalkyl group, a perfluoroalkyl group having 1 to 10 carbon atoms is preferred. Specific examples include a $CF_3$ group, a $CF_3CF_2$ group, a n-$C_3F_7$ group, an i-$C_3F_7$ group, a n-$C_4F_9$ group, a t-$C_4F_9$ group, a s-$C_4F_9$ group, a n-$C_5F_{11}$ group, a $CF_3CF_2C(CF_3)_2$ group, a n-$C_6F_{13}$ group, a $C_8F_{17}$ group, a $C_9F_{19}$ group, a $C_{10}F_{21}$ group, a $CF_3(CF_2)_2CH_2$ group, a $CF_3(CF_2)_4CH_2$ group, and a $CF_3(CF_2)_5CH_2CH_2$ group.

As a perfluoroalkoxy group, a perfluoroalkoxy group having 1 to 10 carbon atoms is preferred. Specific examples include a $CF_3O$ group, a $CF_3CF_2O$ group, a n-$C_3F_7O$ group, an i-$C_3F_7O$ group, a n-$C_4F_9O$ group, a t-$C_4F_9O$ group, a s-$C_4F_9O$ group, a n-$C_5F_{11}O$ group, a $CF_3CF_2C(CF_3)_2O$ group, a n-$C_6F_{13}O$ group, a $C_8F_{17}O$ group, a $C_9F_{19}O$ group, a $C_{10}F_{21}O$ group, a $CF_3(CF_2)_2CH_2O$ group, a $CF_3(CF_2)_4CH_2O$ group, and a $CF_3(CF_2)_5CH_2CH_2O$ group.

Amino groups include an alkylamino group and an arylamino group, and an amino group having 0 to 16 carbon atoms is preferred. Specific examples include an amino group, a monoethylamino group, a diethylamino group, a monohexylamino group, a dihexylamino group, a dioctylamino group, a monododecylamino group, a diphenylamino group, a dixylylamino group, a ditolylamino group, and a monophenyl amino group.

As an alkylthio group, an alkylthio group having 1 to 14 carbon atoms is preferred. Specific examples include a $CH_3S$ group, a $CH_3CH_2S$ group, a n-$C_3H_7S$ group, an i-$C_3H_7S$ group, a n-$C_4H_9S$ group, a t-$C_4H_9S$ group, a s-$C_4H_9S$ group, a n-$C_5H_{11}S$ group, a $CH_3CH_2C(CH_3)_2S$ group, a n-$C_6H_{13}S$ group, a c-$C_6H_{11}S$ group, a $CH_3(CH_2)_5CH_2CH_2S$ group, a $C_6H_{13}S$ group, a $C_8H_{17}S$ group, a $C_9H_{19}S$ group, a $C_{10}H_{21}S$ group, and a 2-ethylhexylthio group.

As a polyalkyleneoxy group, a polyalkyleneoxy group having 3 to 20 carbon atoms is preferred. Specific examples include a polyethyleneoxy group and a polypropyleneoxy group.

As an acyloxy group, an acyloxy group having 1 to 14 carbon atoms is preferred. Specific examples include an acetyloxy group, an ethylcarbonyloxy group, a butylcarbonyloxy group, an octylcarbonyloxy group, a dodecylcarbonyloxy group, and a phenylcarbonyloxy group.

As an alkyloxycarbonyl group, an alkyloxycarbonyl group having 1 to 14 carbon atoms is preferred. Specific examples include a methoxycarbonyl group, an ethoxycarbonyl group, a n-propyloxycarbonyl group, an isopropyloxycarbonyl group, a n-butoxycarbonyl group, a t-butoxycarbonyl group, a n-hexyloxycarbonyl group, and a dodecyloxycarbonyl group.

These groups may further have a substituent.

$R^1$ to $R^{13}$ are preferably an alkyl group, an alkoxy group, an amino group, an alkylthio group, a polyalkyleneoxy group, or a hydrogen atom, more preferably, an alkyl group, an alkoxy group, an alkylthio group, or a polyalkyleneoxy group, and particularly preferably, an alkyl group, an alkoxy group, or a polyalkyleneoxy group.

Y is preferably a carbon atom or a nitrogen atom, and more preferably a carbon atom.

As the repeating units represented by Formulae (1) to (5), the following can be exemplified, in addition to the above-described ones, but the present invention is not limited thereto.

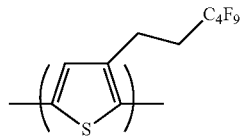
A-17

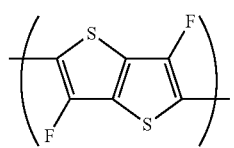
A-18

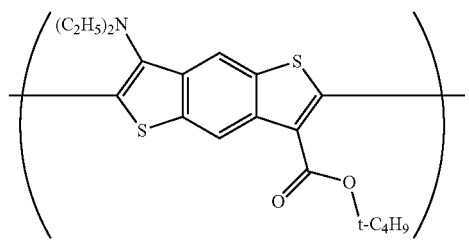
A-19

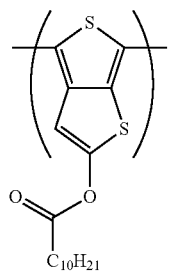
A-20

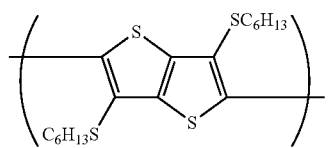
A-21

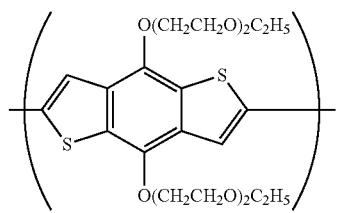
A-22

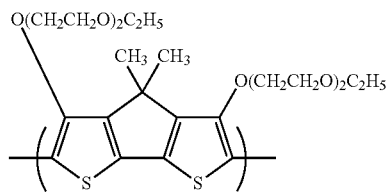
A-23

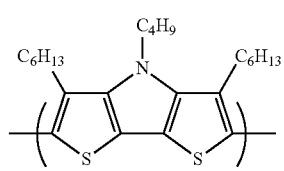
A-24

-continued

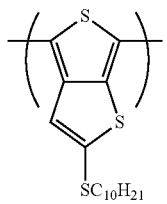

A-25

The molecular weight of the electrically conductive polymer is not particularly limited. The electrically conductive polymer may include a high-molecular-weight one, and an oligomer having molecular weight (for example, a weight average molecular weight of about 1,000 to 10,000) less than the molecular weight of the high molecular weight one.

From a viewpoint of achieving high electrical conductivity, the electrically conductive polymer is preferably hardly degradable by acid, light, or heat. In order to achieve high electrical conductivity, intramolecular carrier transfer through a long conjugated chain of the electrically conductive polymer, and intermolecular carrier hopping are required. In order to achieve the purpose, the molecular weight of the electrically conductive polymer is preferably large to some extent. From this viewpoint, the molecular weight of the electrically conductive polymer used in the present invention is preferably 5,000 or more, more preferably 7,000 to 300,000, and further preferably 8,000 to 100,000 in terms of weight average molecular weight. The weight average molecular weight can be measured by gel permeation chromatography (GPC).

These electrically conductive polymers can be produced by allowing polymerization of the above-described monomer being a constitutional unit by an ordinary oxidation polymerization process.

Moreover, commercially available products can also be used. A specific example includes regioregular poly(3-hexylthiophene-2,5-diyl) manufactured by Aldrich Corporation.

[Onium Salt Compound]

In the present invention, an onium salt compound is used as a dopant to the above-described electrically conductive polymer. The onium salt compound used in the present invention is preferably a compound (acid generator) that generates acid by provision of energy such as light and heat. More specifically, the onium salt compound is preferably a compound (acid precursor) that generates no acid if left alone, but generates acid only when energy such as heat and light is provided from outside.

According to a conventional doping technique, acid such as protonic acid and Lewis acid is used as the dopant. When these dopants are added to the composition, the dopants immediately react with the electrically conductive polymer, and the electrically conductive polymer is cationized, resulting in aggregation, precipitation, and sedimentation. Such a composition has poor coating property, and a quality of the thus formed coating film also deteriorates. On the other hand, in doping using the onium salt compound according to the present invention, a doping effect is produced only when acid is generated by provision of energy such as light and heat. The onium salt compound is neutral in a state before releasing acid, and never reacts with the electrically conductive polymer, and thus never causes cationization. Thus, no aggregation, no precipitation and so forth are caused at the time point when the onium salt compound is added to a composition containing the electrically conductive polymer, and the electrically conductive polymer and the onium salt compound can maintain good dispersibility or solubility. Further, the composition exhibits good coating property and a film quality after coating is also favorable. Moreover, the electrically conductive polymer and the dopant are uniformly dispersed in the formed film. Therefore, the film exhibits high electrical conductivity by giving an external stimulation such as light and heat after coating.

The onium salt compound used in the present invention is preferably a compound that generates acid by provision of heat or irradiation with active energy rays such as radiation and electromagnetic waves. Specific examples of such onium salt compounds include a sulfonium salt, an iodonium salt, an ammonium salt, a carbonium salt, and a phosphonium salt. Among these, a sulfonium salt, an iodonium salt, an ammonium salt, or a carbonium salt is preferred, and a sulfonium salt, an iodonium salt, or a carbonium salt is more preferred. Specific examples of an anion part constituting such a salt include counter anions of strong acid.

Specific examples of the sulfonium salts include compounds represented by the following Formulae (I) and (II), specific examples of the iodonium salts include compounds represented by the following Formula (III), specific examples of the ammonium salts include compounds represented by the following Formula (IV), and specific examples of the carbonium salts include compounds represented by the following Formula (V), respectively, and such compounds are preferably used in the present invention.

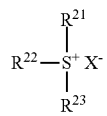

Formula (I)

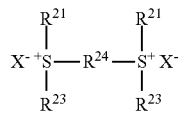

Formula (II)

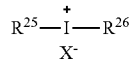

Formula (III)

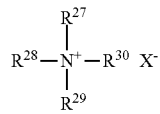

Formula (IV)

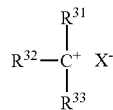

Formula (V)

In Formulae (I) to (V), $R^{21}$ to $R^{23}$, $R^{25}$ to $R^{26}$, and $R^{31}$ to $R^{33}$ each independently represent an alkyl group, an aralkyl group, an aryl group, or an aromatic heterocyclic group. $R^{27}$ to $R^{30}$ each independently represent a hydrogen atom, an alkyl group, an aralkyl group, an aryl group, an aromatic heterocyclic group, an alkoxy group, or an aryloxy group. $R^{24}$ represents an alkylene group or an arylene group. $R^{21}$ to $R^{33}$ may further have a substituent. $X^-$ represents an anion of strong acid.

Any two groups of $R^{21}$ to $R^{23}$ in Formula (I), $R^{21}$ and $R^{23}$ in Formula (II), $R^{25}$ and $R^{26}$ in Formula (III), any two groups of $R^{27}$ to $R^{30}$ in Formula (IV), and any two groups of $R^{31}$ to $R^{33}$ in Formula (V) may be bonded with each other to form an aliphatic ring, an aromatic ring, or a heterocyclic ring.

In $R^{21}$ to $R^{23}$, or $R^{25}$ to $R^{33}$, an alkyl group includes a linear, branched, or cyclic alkyl group. As a linear or branched alkyl group, an alkyl group having 1 to 20 carbon atoms is preferred, and specific examples include a methyl group, an ethyl group, a propyl group, a n-butyl group, a sec-butyl group, a t-butyl group, a hexyl group, an octyl group, and a dodecyl group.

As a cycloalkyl group, an alkyl group having 3 to 20 carbon atoms is preferred. Specific examples include a cyclopropyl group, a cyclopentyl group, a cyclohexyl group, a bicyclooctyl group, a norbornyl group, and an adamantyl group.

As an aralkyl group, an aralkyl group having 7 to 15 carbon atoms is preferred. Specific examples include a benzyl group, and a phenetyl group.

As an aryl group, an aryl group having 6 to 20 carbon atoms is preferred. Specific examples include a phenyl group, a naphthyl group, an anthranyl group, a phenanthryl group, and a pyrenyl group.

Specific examples of the aromatic heterocyclic groups include a pyridyl group, a pyrazol group, an imidazole group, a benzimidazole group, an indole group, a quinoline group, an isoquinoline group, a purine group, a pyrimidine group, an oxazole group, a thiazole group, and a thiazine group.

In $R^{27}$ to $R^{30}$, as an alkoxy group, a linear or branched alkoxy group having 1 to 20 carbon atoms is preferred. Specific examples include a methoxy group, an ethoxy group, an iso-propoxy group, a butoxy group, and a hexyloxy group.

As an aryloxy group, an aryloxy group having 6 to 20 carbon atoms is preferred. Specific examples include a phenoxy group and a naphthyloxy group.

In $R^{24}$, an alkylene group includes a linear, branched, or cyclic alkylene group, and an alkylene group having 2 to 20 carbon atoms is preferred. Specific examples include an ethylene group, a propylene group, a butylene group, and a hexylene group. As a cycloalkylene group, a cycloalkylene group having 3 to 20 carbon atoms is preferred. Specific examples include a cyclopentylene group, cyclohexylene, a bicyclooctylene group, a norbornylene group, and an adamantylene group.

As an arylene group, an arylene group having 6 to 20 carbon atoms is preferred. Specific examples include a phenylene group, a naphthylene group, and an anthranylene group.

When $R^{21}$ to $R^{33}$ further have a substituent, specific examples of preferred substituents include an alkyl group having 1 to 4 carbon atoms, an alkoxy group having 1 to 4 carbon atoms, a halogen atom (a fluorine atom, a chlorine atom, or an iodine atom), an aryl group having 6 to 10 carbon atoms, an aryloxy group having 6 to 10 carbon atoms, an alkenyl group having 2 to 6 carbon atoms, a cyano group, a hydroxyl group, a carboxy group, an acyl group, an alkoxycarbonyl group, an alkylcarbonylalkyl group, an arylcarbonylalkyl group, a nitro group, an alkylsulfonyl group, a trifluoromethyl group, and —S—$R^{41}$. In addition, $R^{41}$ has the same meaning as $R^{21}$.

As $X^-$, an anion of aryl sulfonic acid, an anion of perfluoroalkyl sulfonic acid, an anion of perhalogenated Lewis acid, an anion of perfluoroalkyl sulfonimide, an anion of perhalogenated acid, or an anion of alkyl or aryl borate is preferred. These anions may further have a substituent, and a specific example of the substituent includes a fluoro group.

Specific examples of the anions of aryl sulfonic acid include p-$CH_3C_6H_4SO_3^-$, $PhSO_3^-$, an anion of naphthalene sulfonic acid, an anion of naphthoquinone sulfonic acid, an anion of naphthalene disulfonic acid, and an anion of anthraquinone sulfonic acid.

Specific examples of the anions of perfluoroalkyl sulfonic acid include $CF_3SO_3^-$, $C_4F_9SO_3^-$, and $C_8F_{17}SO_3^-$.

Specific examples of the anions of perhalogenated Lewis acid include $PF_6^-$, $SbF_6^-$, $BF_4^-$, $AsF_6^-$, and $FeCl_4^-$.

Specific examples of the anions of perfluoroalkyl sulfonimide include $CF_3SO_2$—$N^-$—$SO_2CF_3$, and $C_4F_9SO_2$—$N^-$—$SO_2C_4F_9$.

Specific examples of the anions of perhalogenated acid include $ClO_4^-$, $BrO_4^-$, and $IO_4^-$.

Specific examples of the anions of alkyl or aryl borate include $(C_6H_5)_4B^-$, $(C_6F_5)_4B^-$, (p-$CH_3C_6H_4)_4B^-$, and $(C_6H_4F)_4B^-$.

In Formula (I), at least one of $R^{21}$ to $R^{23}$ is preferably an aryl group, and all of $R^{21}$ to $R^{23}$ are more preferably aryl groups. Such an aryl group is preferably unsubstituted or halogen atom-substituted, and more preferably an unsubstituted phenyl group or a halogen atom (preferably chlorine atom)-substituted phenyl group.

In Formula (II), at least one of $R^{21}$ and $R^{23}$ is preferably an aryl group, and $R^{21}$ and $R^{23}$ are more preferably aryl groups. Such an aryl group is preferably unsubstituted or halogen atom-substituted, and more preferably an unsubstituted phenyl group or a halogen atom (preferably chlorine atom)-substituted phenyl group.

In Formula (III), at least one of $R^{25}$ and $R^{26}$ is preferably an aryl group, and $R^{25}$ and $R^{26}$ are more preferably aryl groups. Such an aryl group is preferably unsubstituted or halogen atom-substituted, and more preferably an unsubstituted phenyl group or a halogen atom (preferably chlorine atom)-substituted phenyl group.

In Formula (IV), $R^{27}$ to $R^{30}$ are preferably a hydrogen atom, an alkyl group, or an aryl group.

In Formula (V), at least one of $R^{31}$ to $R^{33}$ is preferably an aryl group, and all of $R^{31}$ to $R^{33}$ are more preferably aryl groups. Such an aryl group is preferably unsubstituted or halogen atom-substituted, and more preferably an unsubstituted phenyl group or a halogen atom (preferably chlorine atom)-substituted phenyl group.

In Formulae (I) to (V), $X^-$ more preferably includes an anion of perhalogenated Lewis acid (preferably $PF_6^-$), an anion of perfluoroalkyl sulfonic acid, an anion of arylsulfonic acid, or an anion of alkyl or aryl borate (preferably, $(C_6H_5)_4B^-$ or $(C_6F_5)_4B^-$), and further preferably, an anion of perhalogenated Lewis acid, an anion of perfluoroalkyl sulfonic acid, or an anion of fluoro-substituted aryl borate.

The onium salt compound more preferably includes a sulfonium salt compound represented by Formula (I). Among these, the onium salt compound preferably includes a sulfonium salt compound in which $R^{21}$ to $R^{23}$ are aryl groups or halogen atom-substituted aryl groups, and $X^-$ is an anion of arylsulfonic acid, an anion of perfluoroalkyl sulfonic acid, an anion of perhalogenated Lewis acid, or an anion of alkyl or aryl borate; more preferably, a sulfonium salt compound in which $R^{21}$ to $R^{23}$ are phenyl groups or halogen atom-substituted phenyl groups, and $X^-$ is an anion of perhalogenated Lewis acid, or an anion of alkyl or aryl borate; and particularly preferably, a sulfonium salt compound in which $R^{21}$ to $R^{23}$ are phenyl groups or chlorine atom-substituted phenyl groups, and $X^-$ is an anion of alkyl or aryl borate.

Specific examples of the onium salt compounds are shown below, but the present invention is not limited thereto.
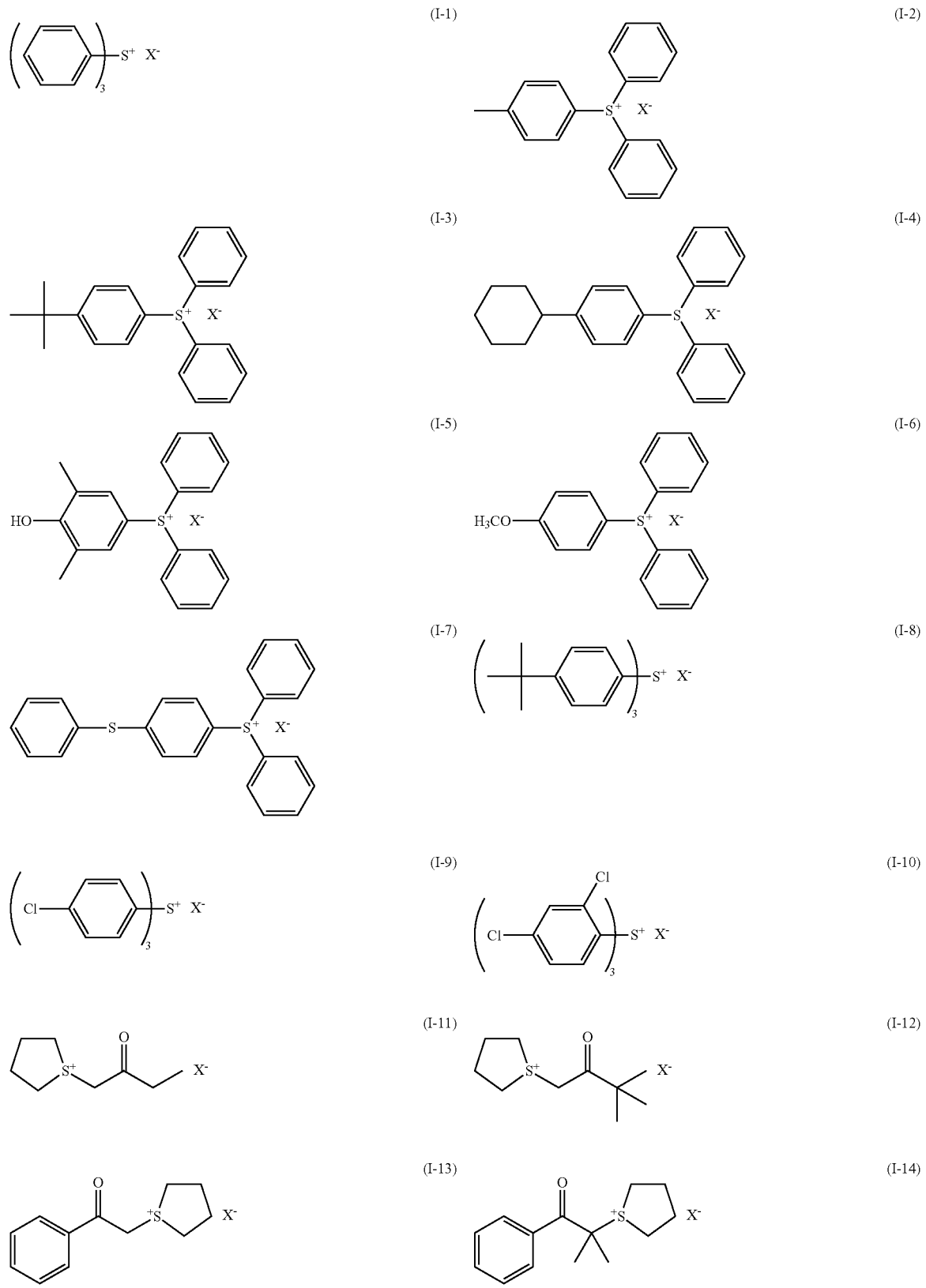

(I-15) 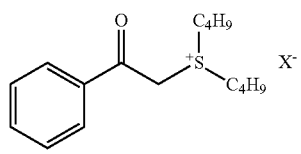
(I-16) 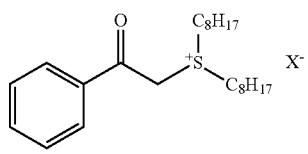
(I-17) 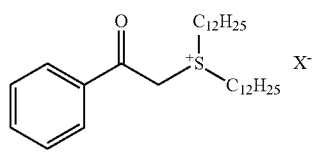
(I-18) 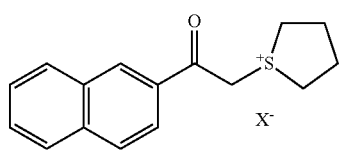
(I-19) 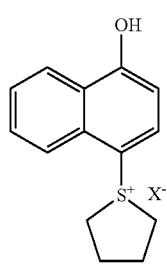
(I-20) 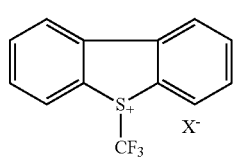
(I-21) 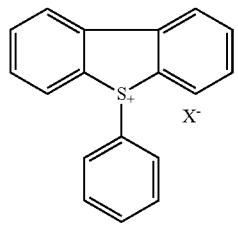
(I-22) 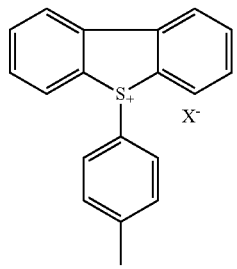
(I-23) 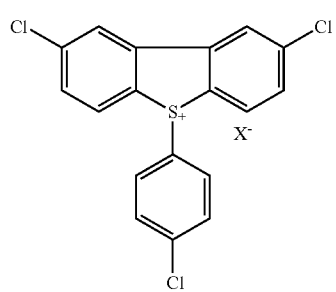
(I-24) 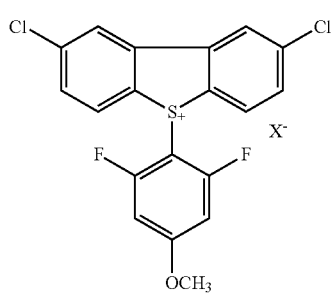
(I-25) 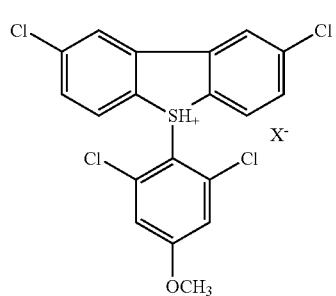
(II-1) 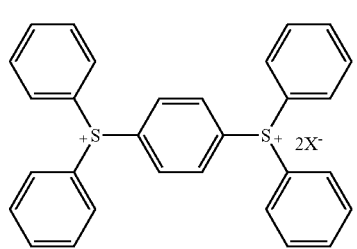

-continued
(II-2)
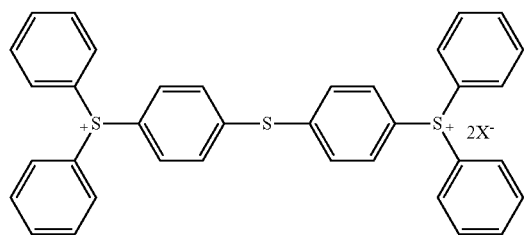
(II-3)
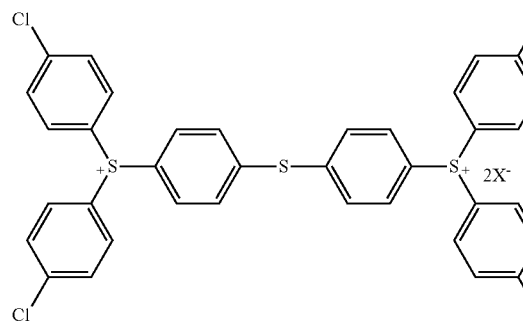
(II-4)
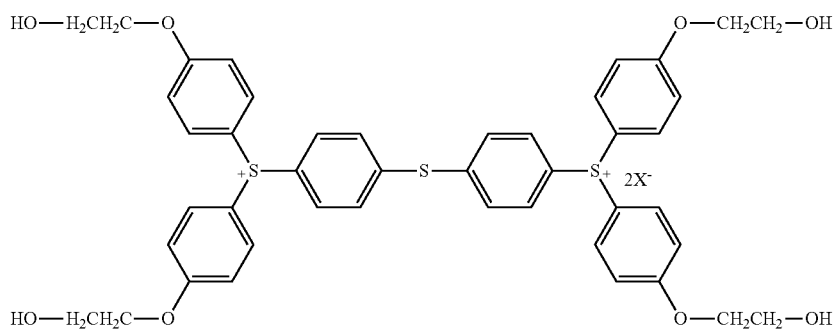
(III-1) 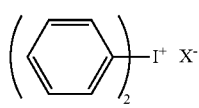
(III-2) 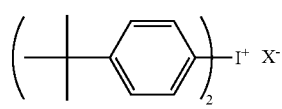
(III-3) 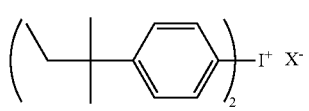
(III-4) 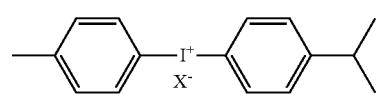
(III-5) 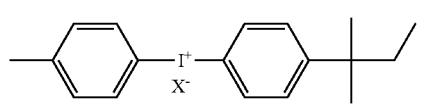
(III-6) 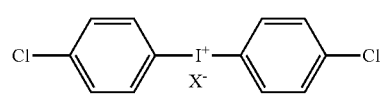
(III-7) 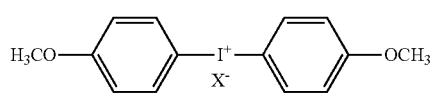
(III-8) 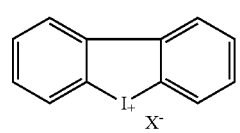
(IV-1) 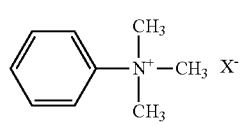
(IV-2) 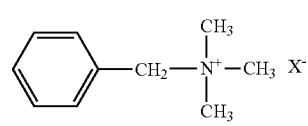
(IV-3) 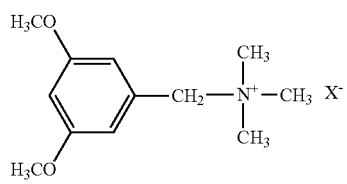
(IV-4) 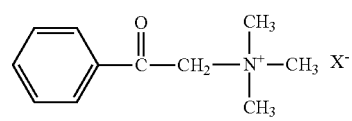
(IV-5) 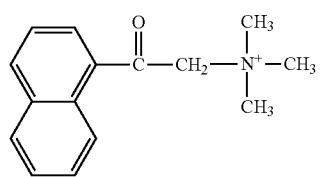
(IV-6) 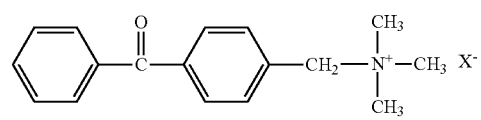

-continued
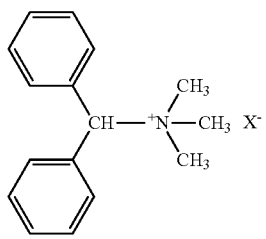 (IV-7)
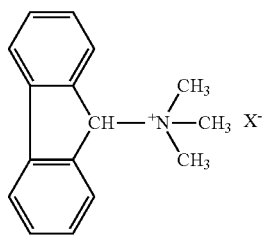 (IV-8)
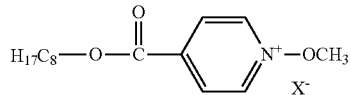 (IV-9)
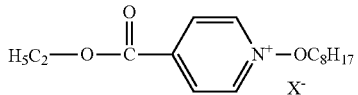 (IV-10)
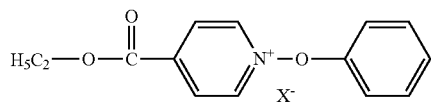 (IV-11)
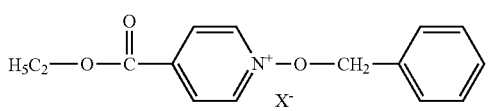 (IV-12)
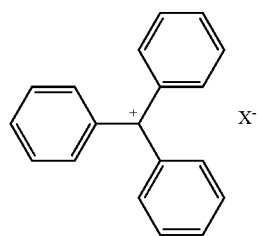 (V-1)
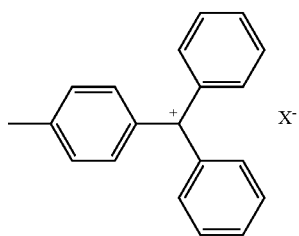 (V-2)
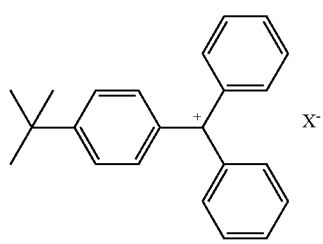 (V-3)
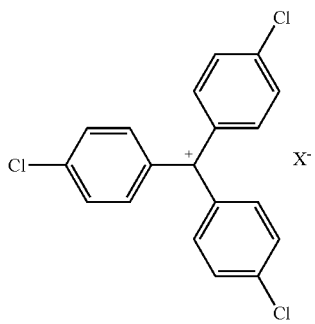 (V-4)
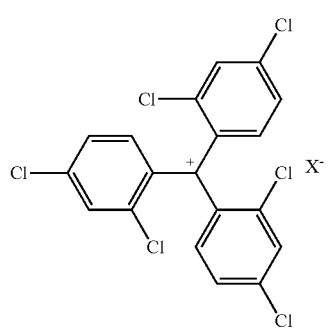 (V-5)
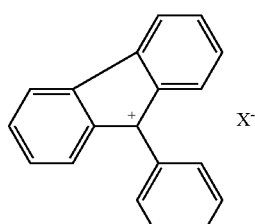 (V-6)

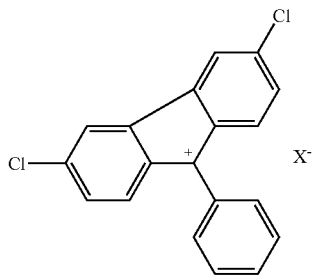
(V-7)

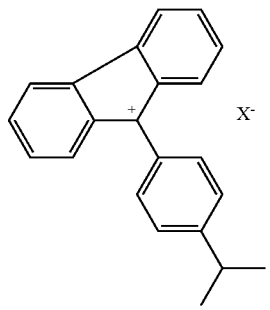
(V-8)

In the above-described specific examples, X⁻ represents $PF_6^-$, $SbF_6^-$, $CF_3SO_3^-$, $CH_3PhSO_3^-$, $BF_4^-$, $(C_6H_5)_4B^-$, $RfSO_3^-$, $(C_6F_5)_4B^-$, or an anion represented by the following formula: and

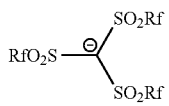

Rf represents a perfluoroalkyl group having an arbitrary substituent.

In the present invention, an onium salt compound represented by the following Formula (VI) or (VII) is particularly preferred.

Formula (VI)

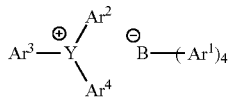

In Formula (VI), Y represents a carbon atom or a sulfur atom, $Ar^1$ represents an aryl group, and $Ar^2$ to $Ar^4$ each independently represent an aryl group or an aromatic heterocyclic group. $Ar^1$ to $Ar^4$ may further have a substituent.

$Ar^1$ preferably includes a fluoro-substituted aryl group; more preferably, a pentafluorophenyl group or a phenyl group replaced by at least one perfluoroalkyl group; and particularly preferably, a pentafluorophenyl group.

The aryl groups or the aromatic heterocyclic groups of $Ar^2$ to $Ar^4$ have the same meaning as the aryl groups or the aromatic heterocyclic groups of $R^{21}$ to $R^{23}$, or $R^{25}$ to $R^{33}$, and are preferably an aryl group, and more preferably a phenyl group. These groups may further have a substituent, and specific examples of the substituents include the above-mentioned substituents of $R^{21}$ to $R^{33}$.

Formula (VII)

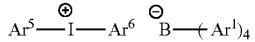

In Formula (VII), $Ar^1$ represents an aryl group, and $Ar^5$ and $Ar^6$ each independently represent an aryl group or an aromatic heterocyclic group. $Ar^1$, $Ar^5$, and $Ar^6$ may further have a substituent.

$Ar^1$ has the same meaning as $Ar^1$ in Formula (VI), and a preferred range thereof is also the same.

$Ar^5$ and $Ar^6$ each have the same meaning as $Ar^2$ to $Ar^4$ in Formula (VI), and a preferred range thereof is also the same.

The onium salt compound can be produced by an ordinary chemical synthesis. Moreover, a commercially available reagent or the like can also be used.

One embodiment of a synthetic method of the onium salt compound is represented below, but the present invention is in no way limited thereto. Any other onium salt compound can also be synthesized by a similar technique.

Into a 500 mL volume three-necked flask, 2.68 g of triphenylsulfonium bromide (manufactured by Tokyo Chemical Industry Co., Ltd.), 5.00 g of a lithium tetrakis (pentafluorophenyl)borate-ethyl ether complex (manufactured by Tokyo Chemical Industry Co., Ltd.), and 146 mL of ethanol are put, the resultant mixture is stirred at room temperature for 2 hours, and then 200 mL of pure water is added thereto, and a precipitated white solid is fractionated by filtration. This white solid is washed with pure water and ethanol, and subjected to vacuum drying, and thus as an onium salt 6.18 g of triphenylsulfonium tetrakis(pentafluorophenyl)borate can be obtained.

The onium salt compounds can be used alone in one kind or in combination with two or more kinds.

In the present invention, the onium salt compound is used as the dopant. From a viewpoint of achieving a good doping effect, such an onium salt compound is used preferably in an amount of 10 parts by mass or more, more preferably, 25 to 80 parts by mass, and further preferably, 30 to 70 parts by mass, based on 100 parts by mass of the electrically conductive polymer.

[Solvent]

The electrically conductive composition of the present invention preferably contains a solvent in addition to the electrically conductive polymer and the onium salt compound. The electrically conductive composition of the present invention has good solubility or dispersibility. When the electrically conductive composition is dissolved or dispersed in the solvent, there is almost no agglomerate and no precipitate.

The solvent only needs to allow good dispersion or dissolution of the electrically conductive polymer and the onium salt compound, and water, an organic solvent, and a mixed solvent of these solvents can be used. The solvent is preferably an organic solvent, and preferably includes alcohol; a halogen-based solvent such as chloroform; an aprotic polar solvent such as DMF, NMP, and DMSO; an aromatic solvent such as chlorobenzene, dichlorobenzene, benzene, toluene, xylene, mesitylene, tetralin, tetramethyl benzene, and pyridine; a ketone-based solvent such as cyclohexanone, acetone, and methyl ethyl ketone; and an ether-based solvent such as diethyl ether, THF, t-butyl methyl ether, dimethoxyethane, and diglyme; and more preferably, a halogen-based solvent such as chloroform; an aprotic polar solvent such as DMF and NMP; an aromatic solvent such as dichlorobenzene, xylene, tetralin, and tetramethyl benzene; and an ether-based solvent such as THF.

Moreover, it is preferred that the solvent is previously degassed. A dissolved oxygen concentration in the solvent is preferably adjusted to be 10 ppm or less. Specific examples of methods of degasification include a method of irradiation with ultrasonic waves under reduced pressure, and a method of bubbling an inert gas such as argon.

Further, it is preferred that the solvent is previously dehydrated. The moisture content in the solvent is preferably adjusted to be 1,000 ppm or less, and more preferably, to be 100 ppm or less. As a method of dehydration, a known method, such as a method using a molecular sieve, and distillation, can be applied.

[Other Component]

In addition to the above described components, the composition according to the present invention may contain, as appropriate, an antioxidant, a light-resistant stabilizer, a heat-resistant stabilizer, or a plasticizer. The content of these components is preferably 5% by mass or less based on the total mass of the composition.

Specific examples of the antioxidants include IRGANOX 1010 (manufactured by Nihon Ciba-Geigy K.K.), SUMILIZER GA-80 (manufactured by Sumitomo Chemical Co., Ltd.), SUMILIZER GS (manufactured by Sumitomo Chemical Co., Ltd.), and SUMILIZER GM (manufactured by Sumitomo Chemical Co., Ltd.).

Specific examples of the light-resistant stabilizers include TINUVIN 234 (manufactured by BASF), CHIMASSORB 81 (manufactured by BASF), and CYASORB UV-3853 (manufactured by SUN CHEMICAL COMPANY LTD.).

A specific example of the heat-resistant stabilizer includes IRGANOX 1726 (manufactured by BASF).

A specific example of the plasticizer includes ADK CIZER RS (manufactured by ADEKA CORPORATION).

From a viewpoint of improving the electrical conductivity, the content of a reactive component other than the onium salt compound contained in the electrically conductive composition is preferably 1% by mass or less. The reactive component means a component that causes a reaction accompanying a large change in the molecular weight over time or by providing energy such as light and heat. Specific examples of the reactive component include a degradable polymer, a curable (polymerizable) monomer, and a cross-linking agent.

If the reaction accompanying the large change in the molecular weight is caused in the compound contained in the composition, volume shrinkage or a density distribution is caused, and thus a crack, a void, a grain boundary, or the like is generated in the composition. The thus generated crack, void, or the like causes interfacial resistance, thereby decreasing the electrical conductivity of the composition. Consequently, in the present invention, a content ratio of the reactive component in the composition is preferably suppressed low in order to allow an improvement in uniformity in the composition, to decrease electric resistance and to improve the electrical conductivity.

Moreover, the electrically conductive composition of the present invention preferably does not contain any dopant other than the onium salt compound. If the conventional dopant such as protonic acid and Lewis acid is added to the composition, such a dopant immediately reacts with the electrically conductive polymer to cause aggregation, precipitation and sedimentation, and thus causes deterioration of the coating property or film-forming property of the composition.

[Preparation of Electrically Conductive Composition]

The electrically conductive composition of the present invention is formed by containing an electrically conductive polymer and an onium salt compound, and adding a solvent when necessary. In the preparation of the electrically conductive composition of the present invention, the electrically conductive polymer is contained preferably in an amount of 30 to 80% by mass, more preferably 40 to 75% by mass, and further preferably 50 to 70% by mass, in the total solid content. The content of the onium salt compound in the electrically conductive composition is preferably 10 to 60% by mass, more preferably 15 to 50% by mass, and further preferably 20 to 40% by mass, in the total solid content.

When the solvent is used, the content of the solvent in the composition is preferably 95 to 99.99% by mass, and more preferably 98 to 99.9% by mass.

The electrically conductive composition of the present invention can be prepared by mixing each of the above-described components. The preparation method is not particularly limited, but the composition can be produced using an ordinary mixer or the like under an ordinary temperature and an ordinary pressure. For example, the composition is preferably prepared by stirring, shaking or using ultrasonic waves to promote dissolution or dispersion. Moreover, the composition is preferably prepared in a state of shielding radiation, electromagnetic waves, and so forth under a temperature at which no acid is generated from the onium salt compound.

In the composition of the present invention, as mentioned above, aggregation and so forth of the electrically conductive polymer by acid are not caused, and uniform dispersibility and solubility of the electrically conductive polymer and the onium salt compound can be kept during preparation and storage of the composition.

Moreover, the electrically conductive composition of the present invention has excellent film-forming property (film quality), and no cissing (preferably, 40 degrees or less in a contact angle) upon coating onto a substrate, and thus can form a coating film having a small degree of film surface unevenness (preferably, less than 10 nm in surface roughness (Ra)).

The electrically conductive composition of the present invention has the moisture content preferably in an amount of 0.01% by mass or more to 15% by mass or less. The moisture content is more preferably 0.05% by mass or more to 10% by mass or less, and further preferably 0.1% by mass or more to 5% by mass or less.

When the moisture content of the composition is controlled within such specified range, a further improvement in the electrical conductivity can be achieved. As is demonstrated in Examples described later, when the onium salt compound is used as the dopant, and the moisture content (moisture concentration) of the composition is kept within the specified range, the doping effect is further improved, and the high electrical conductivity can be achieved. This effect is particularly significant when the electrically conductive polymer has a repeating unit derived from a thiophene compound.

In a case where the moisture content of the electrically conductive composition is within the above-described range, doping efficiency and the electrical conductivity are improved, and simultaneously the coating film has excellent physical strength after coating and film formation, and enhanced stability to physical impact from outside or friction, and therefore such a case is preferred. Moreover, the coating film has excellent wet heat resistance, and also improved stability over time.

The moisture content of the composition can be evaluated by measuring the equilibrium moisture content at a predetermined temperature and humidity. With regard to the equilibrium moisture content, a sample is allowed to stand at 25° C. and 60% RH for 6 hours and reaches equilibrium, and then measurement is carried out according to a Karl-Fischer method by means of a moisture meter and a sample dryer (CA-03 and VA-05, respectively, both manufactured by Mitsubishi Chemical Corporation), and thus the equilibrium moisture content can be calculated by dividing the amount of moisture (g) by sample weight (g).

The moisture content of the composition can be controlled by allowing a sample to stand in a thermo-hygrostat (temperature: 25° C., humidity: 85% RH) (in a case of increasing the moisture content), or by drying the sample in a vacuum dryer (temperature: 25° C.) (in a case of decreasing the moisture content). Moreover, upon preparing a composition liquid, the moisture content can also be controlled by adding a necessary amount of water (in the case of increasing the moisture content), or by using a dehydrated solvent (specific examples include various dehydrated solvents manufactured by Wako Pure Chemical Industries, Ltd.) to prepare the composition (film or the like) in a dry box under a nitrogen atmosphere (in the case of decreasing the moisture content).

When the composition of the present invention is processed into the form of the electrically conductive film or the like, the moisture content is preferably controlled after a film formation process described later. For example, each component such as the electrically conductive polymer and the onium salt compound is mixed in a solvent and dispersed thereinto; and then the resultant mixture is processed into a desired form such as a film; and then the moisture content thereof is controlled to obtain the electrically conductive composition having the moisture content within the above-described range.

[Electrically Conductive Film]

The electrically conductive film of the present invention is formed by shaping the electrically conductive composition, and providing a shaped product with heat or active energy rays. The electrically conductive film is preferably shaped by coating the electrically conductive composition onto the substrate to perform film formation, and when necessary, drying by vaporizing the solvent or the like, and then applying heating or irradiation with active energy rays.

[Film Formation]

A method for forming the electrically conductive film is not particularly limited, but known coating methods, such as a spin coating, extrusion die coating, blade coating, bar coating, screen printing, stencil printing, roll coating, curtain coating, spray coating, dip coating, and ink-jet process can be used.

After coating, when necessary, a drying step is applied. For example, the solvent can be vaporized and dried by blowing hot air.

An amount of the electrically conductive composition to be used is adjusted as appropriate depending on desired film thickness. The thickness of the electrically conductive film may be selected as appropriate according to a use. For example, when the film is used for a transparent electrode, a resistance value and luminous transmittance become important. In a case of the transparent electrode for a display unit for an LCD, a PDP, an EL device, or the like, a preferred resistance value is in the range of 0.001 to 100,000 $\Omega$/square, and more preferably in the range of 0.1 to 10,000 $\Omega$/square. The luminous transmittance at 550 nm is in the range of about 40% to about 100%, preferably in the range of 50 to 100%, and more preferably in the range of 60 to 100%. The film thickness is adjusted as appropriate so as to meet these ranges in consideration of a concentration of the electrically conductive polymer or the onium salt compound.

[Doping]

The electrically conductive composition of the present invention is subjected to doping by provision of heat or active energy rays. The onium salt compound in the electrically conductive composition is decomposed by heating or irradiation with active energy rays and changed to acid. The generated acid protonates the electrically conductive polymer, and thus the electrically conductive polymer is subjected to doping with a positive electric charge (p-type doping). By this doping process, the electrical conductivity is improved.

In the preparation of the electrically conductive composition of the present invention, such doping treatment is preferably applied in order to improve the electrical conductivity of the composition. Timing of the doping treatment is not particularly limited, but when the composition is subjected to processing into desired forms such as a film, the doping treatment is preferably applied after such processing. Moreover, the doping treatment is preferably applied after a treatment for controlling the moisture content of the composition.

The active energy rays include radiation and electromagnetic waves, and the radiation includes particle beams (high-speed particle beams) and electromagnetic radiation. Specific examples of the particle beams include charged particle beams such as alpha rays ($\alpha$-rays), beta rays ($\beta$-rays), proton beams, electron beams (meaning ones accelerating an electron by means of an accelerator without depending on nuclear decay), and deuteron beams; non-charged particle beams such as neutron beams; and cosmic rays. Specific examples of the electromagnetic radiation include gamma rays ($\gamma$-rays) and X-rays (X-rays and soft X-rays). Specific examples of the electromagnetic waves include radio waves, infrared rays, visible rays, ultraviolet rays (near-ultraviolet rays, far-ultraviolet rays, and extreme ultraviolet rays), X-rays, and gamma rays. Types of active energy rays used in the present invention are not particularly limited. For example, electromagnetic waves having a wavelength near a maximum absorption wavelength of the onium salt compound to be used may be selected as appropriate.

Among these active energy rays, from viewpoints of the doping effect and safety, ultraviolet rays, visible rays, or infrared rays are preferred, and ultraviolet rays are more preferred. Specifically, the active energy rays include rays having a maximum emission wavelength in the range of 240 to 1,100 nm, preferably in the range of 240 to 850 nm, and more preferably in the range of 240 to 670 nm.

For irradiation with active energy rays, radiation equipment or electromagnetic wave irradiation equipment is used. A wavelength of radiation or electromagnetic waves for irradiation is not particularly limited, and one allowing radiation or electromagnetic waves in a wavelength region corresponding to a response wavelength of the onium salt compound to be used may be selected.

Specific examples of the equipment allowing radiation or irradiation with electromagnetic waves include exposure equipment using as a light source an LED lamp, a mercury lamp such as a high-pressure mercury lamp, an ultra-high pressure mercury lamp, a Deep UV lamp, and a low-pressure UV lamp, a halide lamp, a xenon flash lamp, a metal halide lamp, an excimer lamp such as an ArF excimer lamp and a KrF excimer lamp, an extreme ultraviolet ray lamp, electron beams, and an X-ray lamp. Irradiation with ultraviolet rays can be applied using ordinary ultraviolet ray irradiation equipment such as commercially available ultraviolet ray irradiation equipment for curing/bonding/exposure use (for example, SP9-250UB, USHIO INC.).

Exposure time and an amount of light may be selected as appropriate in consideration of a kind of onium salt compound to be used and the doping effect. Specific examples of the amount of light include 10 mJ/cm$^2$ to 10 J/cm$^2$, and preferably 50 mJ/cm$^2$ to 5 J/cm$^2$.

With regard to doping by heating, a substrate having an electrically conductive composition coated thereon (formed film) may be heated to a temperature at which the onium salt compound generates acid, or higher. A heating temperature is preferably 50° C. to 200° C., and more preferably 70° C. to 120° C. Heating time is preferably 5 minutes to 3 hours, and more preferably 15 minutes to 1 hour.

[Electrically Conductive Laminate and Electrically Conductive Articles]

The film formed of the electrically conductive composition of the present invention can also be used as an electrically conductive film, and also as an electrically conductive laminate in which the electrically conductive films are laminated on a substrate. The electrically conductive laminate may further have an electrode or the like.

[Substrate]

A substrate used for the electrically conductive film or the electrically conductive laminate can be selected as appropriate according to uses therefor. For example, when the electrically conductive film of the present invention is used as an electrode for a display unit such as an LCD, an electrophoretic display material, electronic paper, and an organic EL device, a glass substrate or a plastic substrate can be preferably used. Moreover, a metal substrate having an insulating film between the substrate and the electrically conductive film can also be used. In addition, the substrate is not limited to a plate shape, but can be selected from one having a curved surface, one having an uneven surface, or the like, according to a use.

Moreover, a substrate formed by arranging an electrode material on a surface in contact with the electrically conductive film may also be used. As the electrode materials, such material can be used as a transparent electrode material such as ITO and ZnO, a metal electrode material such as silver, copper, gold, and aluminum, a carbon material such as a CNT and graphene, an organic material such as PEDOT/PSS, an electrically conductive paste into which electrically conductive particulates such as silver and carbon particulates are dispersed, and an electrically conductive paste containing metal nanowires of silver, copper, or aluminum.

In consideration of a doping treatment by heating or irradiation with light after film formation, a substrate that is less susceptible to these stimuli is preferably selected. Specific examples of the substrates that can be used in the present invention include a substrate made of glass, transparent ceramics, a metal, or a plastic film. The glass or the transparent ceramics have poorer flexibility in comparison with the metal or the plastic film. Moreover, when the metal and the plastic film are compared in terms of prices, the plastic film is less expensive, and has higher flexibility, and therefore is preferred.

From such viewpoints, as the substrate according to the present invention, a plastic film (resin film) of a polyester-based resin, polyimide, polycarbonate, polypropylene, polyether sulfone, a cycloolefin polymer, or the like is preferred, and a polyester-based resin (hereinafter, occasionally referred to as "polyester") is particularly preferred. As the polyester, linear saturated polyester synthesized from aromatic dibasic acid or an ester-forming derivative thereof, and diol or an ester-forming derivative thereof is preferred.

Specific examples of the polyester that can be used in the present invention include polyethylene terephthalate, polyethylene isophthalate, polyethylene naphthalate, polybutylene terephthalate, poly(1,4-cyclohexylenedimethylene-terephthalate), and polyethylene-2,6-phtalenedicarboxylate. Among them, polyethylene terephthalate, polyethylene naphthalate, or the like is preferred from viewpoints of easy availability, economic efficiency, and an effect thereof.

Moreover, unless advantageous effects of the present invention are adversely affected, a copolymer of the above-described resin, or a blend of these resins and any other kind of resins can also be used.

Further, in order to improve slip properties, a small amount of inorganic or organic fine particles may be incorporated into this polyester film. The particles include an inorganic filler such as titanium oxide, calcium carbonate, silica, barium sulfate, and silicone; an organic filler such as acryl, benzoguanamine, Teflon (registered trade name), and epoxy; and a bonding property improver and an antistatic agent, such as polyethylene glycol (PEG) and sodium dodecylbenzenesulfonate.

The polyester film used in the present invention can be formed by processing the above-described polyester resin into a film form by melting extrusion, orientation and crystallization by biaxial stretching in both horizontal and vertical directions, and crystallization by heat treatment. With regard to methods for producing these films, a known method or conditions can be selected as appropriate and used.

The thickness of the polyester film used herein is not particularly limited, and can be selected as appropriate according to the purpose of using the film, but generally a 5 to 500 μm-thick one is preferably used.

The substrate preferably further contains an additive such as an ultraviolet ray absorber. As the ultraviolet ray absorber, an oxazol-based, triazine-based, stilbene-based, or coumarin-based absorber can be preferably used.

In the present invention, when necessary, pretreatment may be applied to the substrate. For example, in order to improve adhesion to the electrically conductive film, an easy-bonding layer can be arranged on the substrate. Moreover, in order to improve adhesion to the electrically conductive film, surface treatment of the substrate may be applied as the pretreatment.

Specific examples of the easy-bonding layers include a layer of gelatin, polyacrylic acid, polyacrylate, a styrene-butadiene copolymer (hereinafter, abbreviated as "SBR" as appropriate), and an aqueous urethane resin. Further, the layers may further contain a crosslinking agent.

The styrene-butadiene copolymer prepared as a latex is preferably used. Specifically, commercial items can be used, such as NIPOL (trade name, manufactured by ZEON CORPORATION), NAUGATEX (trade name, manufactured by Sumitomo Naugatuck Co., Ltd.), CROSSLENE (trade name, manufactured by Takeda Pharmaceutical Company Ltd.), and ASAHI DOW LATEX (trade name, manufactured by ASAHI-DOW CO., LTD.), and others being sold by DIC Corporation and overseas manufacturers.

In a case of the latex, a size of dispersion particles is preferably 5 μm or less, more preferably 1 μm or less, and further preferably 0.2 μm or less. When the particle size is large, it causes aggregation in an coating step, or poor transparency, gloss, or the like of the film. Further, when the thickness of the coated layer is reduced, the particle size is required to be decreased according to the thickness.

A content ratio of styrene/butadiene in the styrene butadiene copolymer is preferably about 50/50 to about 80/20. A ratio of SBR contained in the latex is preferably 30 to 50% by weight as solid weight.

Moreover, a crosslinking agent may be added to this easy-bonding layer. As the cross linking agent, a triazine-based crosslinking agent is preferred.

Specific examples of methods for surface treatment of the substrate include corona treatment, plasma treatment, UV-ozone treatment, and chemical treatment using acid or alkali by a method described in JIS K 6843-3: 1999, or a method in accordance therewith. A hydroxyl group, a carboxyl group, a basic group or the like having polarity can be formed on the substrate surface by the treatment described above, and thus adhesion to the electrically conductive film is improved.

As showing in Examples later, in the electrically conductive film of the present invention, a high electrical conductivity of about 0.1 to about 10 S/cm can be achieved by adjusting the type, the content, or the like of the above-described electrically conductive composition or onium salt compound. Therefore, the electrically conductive composition, the electrically conductive film, or the electrically conductive laminate of the present invention can be widely applied to various kinds of electrically conductive articles. For example, the electrically conductive composition, the electrically conductive film, or the electrically conductive laminate can be preferably used for an electrode for a flat panel display for an LCD, a PDP, an EL device, a solar cell, or a touch panel; an electrically conducting material for a condenser, a capacitor, or a secondary cell; an organic semiconductor material for a photoelectric conversion device, a piezoelectric conversion device, a thermoelectric conversion device, or an FET device; a material for a light modulation device, an antistatic material, or the like.

EXAMPLES

The present invention will be described in more detail based on the following examples, but the invention is not intended to be limited thereto.

Example 1-1

To 100 mg of electrically conductive polymer 1 having a structure shown below (weight average molecular weight=87,000, manufactured by Aldrich Corporation), 16.5 mL of mixed solvent of xylene/tetrahydrofuran (1:1 in a volume ratio) was added, and the resultant mixture was sufficiently dissolved at 60° C. using an ultrasonic water bath. Then, 65.5 mg of onium salt compound 1 having a structure shown below was added thereto and dissolved at room temperature, and thus a mixed solution was prepared. Solubility of the solution prepared was evaluated by the evaluation technique described below.

Subsequently, a glass substrate having a thickness of 1.1 mm and a size of 40 mm×50 mm was subjected to ultrasonic cleaning in acetone, and subjected to UV-ozone treatment for 10 minutes. The mixed solution prepared as described above was subjected to spin coating (1,500 rpm, 30 seconds) onto this glass substrate, and then the resultant coated product was dried for 10 hours at room temperature and under vacuum conditions, and thus an electrically conductive film having a thickness of about 50 nm was formed.

Then, irradiation with ultraviolet rays (amount of light: 1.06 J/cm$^2$) was applied using a UV irradiator (ECS-401GX, manufactured by EYE GRAPHICS Co., Ltd.), and thus an electrically conductive polymer was subjected to doping. The doping of the electrically conductive film was confirmed by the following manner. The electrically conductive film obtained was evaluated with regard to the electrical conductivity, film-forming property, and presence or absence of dopant volatilization. The results are shown in Table 1.

[Confirmation of Doping]

Measurement (determination) of the electrically conductive film being subjected to doping as desired was allowed as described below.

An absorption spectrum of the film was measured in a wavelength region of 300 to 2,000 nm. If the film was subjected to doping, a new absorption peak is developed. The new absorption peak appears on a longer wavelength side of main absorption of a film without doping.

In the examples, when this absorption peak was observed, the electrically conductive film was judged to be subjected to doping as desired.

[Solubility]

A solvent and a solid component were dissolved or dispersed, and the resultant mixture was left to stand for 5 minutes, and then solubility was evaluated based on criteria of visual observation of sediment or an aggregate, and filterability using each membrane filter (material: PTFE) having a pore size of 0.2 to 1.0 µm. In practical use, the resultant mixture preferably meets criteria A to C.

A: No sediment and no aggregate are visually observed at all, and filtration using a membrane filter having a pore size of 0.2 µm is allowed.

B: No sediment and no aggregate are visually observed at all, and filtration using a membrane filter having a pore size of 0.45 µm is allowed, but filtration using a membrane filter having a pore size of less than 0.45 µm is difficult.

C: No sediment and no aggregate are visually observed at all, and filtration using a membrane filter having a pore size of 1 µm is allowed, but filtration using a membrane filter having a pore size of less than 1 µm is difficult.

D: No sediment and no aggregate are visually observed at all, and filtration using a membrane filter having a pore size of 1 µm is difficult.

E: Sediment or an aggregate is visually observed.

[Measurement of Electrical Conductivity]

With regard to the electrical conductivity of an electrically conductive film obtained, surface resistivity (unit: Ω/square) was measured using a "high resistivity meter: Hiresta UP" or a "low resistivity meter: Loresta GP" (both are names of instruments manufactured by Mitsubishi Chemical Analytech Co., Ltd.), and film thickness (unit: cm) was measured by means of a stylus type film thickness meter, and the electrical conductivity (S/cm) was calculated from the following formula.

(Electrical conductivity)=1/((Surface electrical resistance)×(Film thickness))

[Film-Forming Property]

During application by spin coating, wettability (no cissing of a liquid) between a composition liquid and a substrate, and surface unevenness after drying the film were observed, and evaluation was made according to the criteria below. In addition, the surface unevenness of the film was observed by measuring surface roughness (Ra) by means of a stylus type film thickness meter. In practical use, the film forming property preferably meets criteria A to C.

A: No coating unevenness is visually observed, and surface roughness (Ra) of a film is less than 2.5 nm.
B: No coating unevenness is visually observed, and surface roughness (Ra) of a film is 2.5 nm or more and less than 5 nm.
C: No coating unevenness is visually observed, and surface roughness (Ra) of a film is 5 nm or more and less than 10 nm.
D: No coating unevenness is visually observed, and surface roughness (Ra) of a film is 10 nm or more and less than 20 nm.
E: A high degree of coating unevenness is visually observed, and surface roughness (Ra) of a film is 20 nm or more.

[Dopant Volatility]

When an onium salt compound was used as a dopant, the electrical conductivity immediately after completion of irradiation with ultraviolet rays, and the electrical conductivity after elapse of 1 hour from completion of irradiation with ultraviolet rays were compared, and a case where no change was found was judged to be "No" in volatility.

In a case of vapor phase iodine doping or the like, a sample was subjected to doping by being exposed under an iodine gas atmosphere, and then the electrical conductivity immediately after return into an air atmosphere, and the electrical conductivity after elapse of 1 hour from the return into the air atmosphere were compared. A case where no change was found was judged to be "No" in volatility, and a case where any change was found was judged to be "Yes" in volatility.

Examples 1-2 to 1-23

Electrically conductive films were produced and evaluated in the same manner as Example 1-1 except that kinds of electrically conductive polymers and onium salt compounds were changed as shown in Table 1. The results are shown in Table 1.

Electrically conductive polymer 1

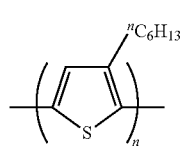

Electrically conductive polymer 2

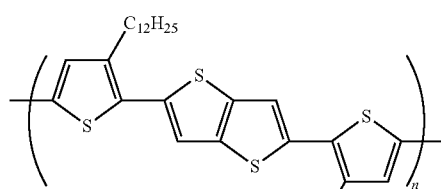

Electrically conductive polymer 3

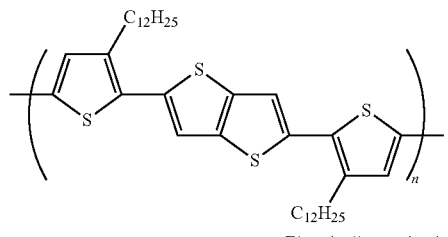

Electrically conductive polymer 4

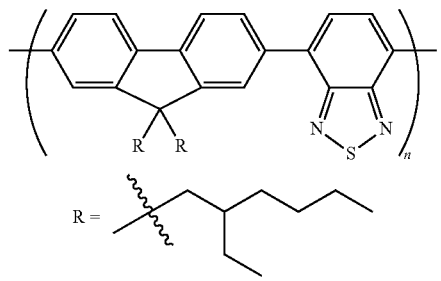

Electrically conductive polymer 5

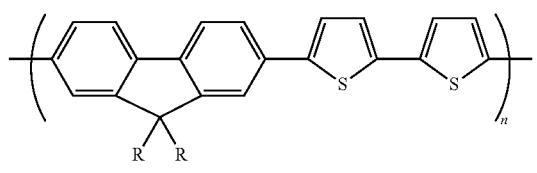

$R = {}^nC_8H_{17}$

Electrically conductive polymer 6

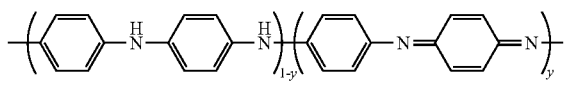

Electrically conductive polymer 7

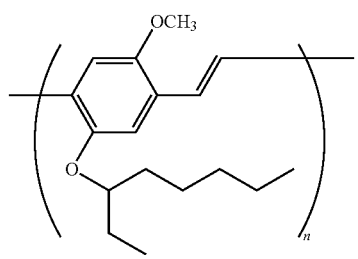

Electrically conductive polymer 8

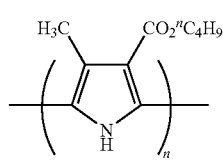

Electrically conductive polymer 9

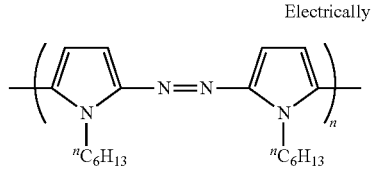

Onium salt compound 1

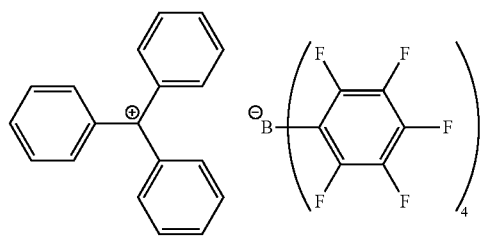

Onium salt compound 2
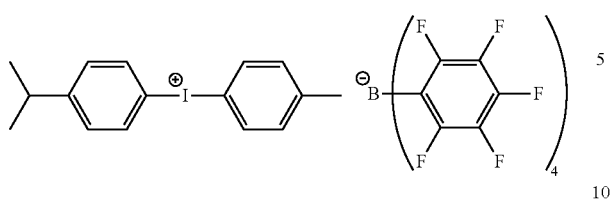
Onium salt compound 3
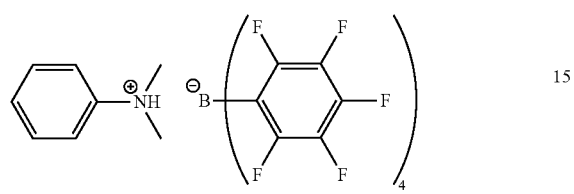
Onium salt compound 4
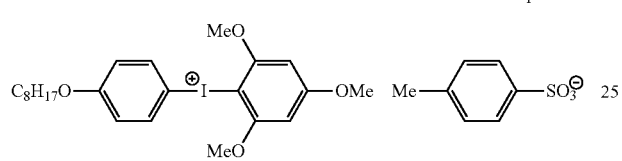
Onium salt compound 5
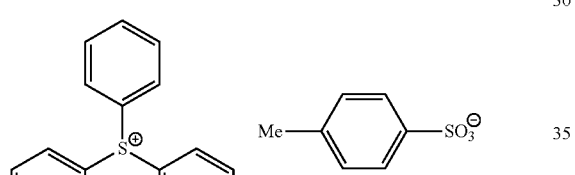
Onium salt compound 6
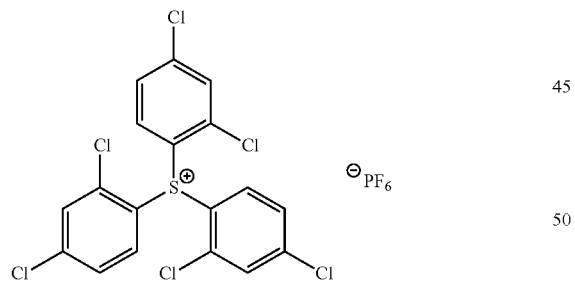
Onium salt compound 7
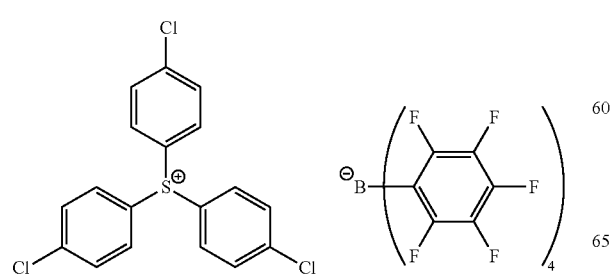
Onium salt compound 8
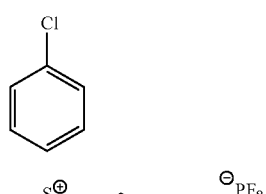
Onium salt compound 9
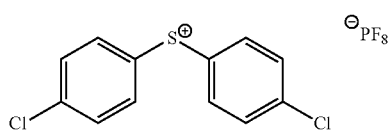
Onium salt compound 10
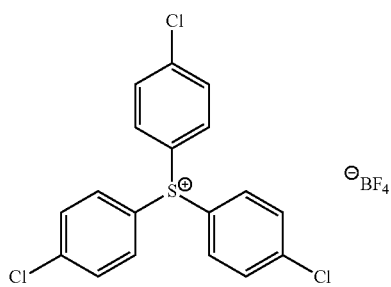
Onium salt compound 11
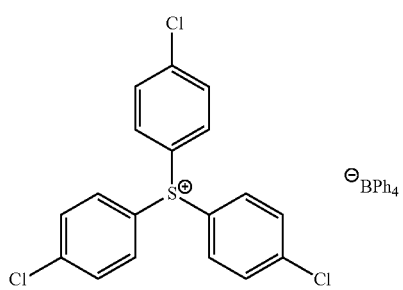
Onium salt compound 12
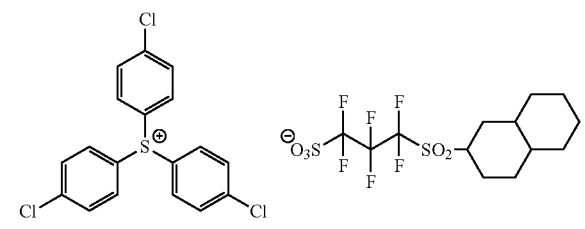
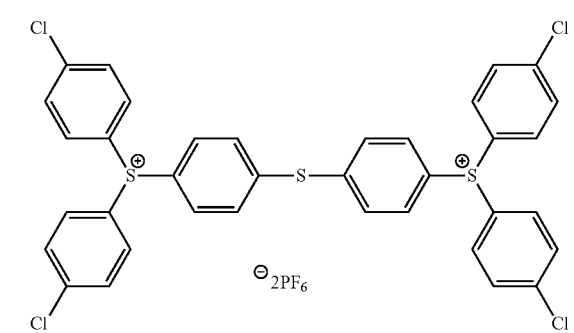

-continued

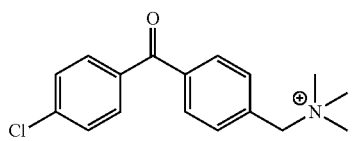

Onium salt compound 13

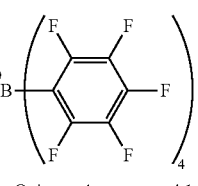

Onium salt compound 14

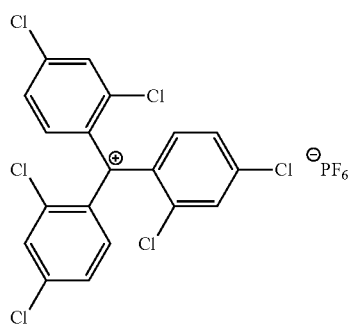

Molecular weight of each of the electrically conductive polymers 1 to 9 used is as described below.

Electrically conductive polymer 1: Weight average molecular weight=87000

Electrically conductive polymer 2: Weight average molecular weight=77000

Electrically conductive polymer 3: Weight average molecular weight=103000

Electrically conductive polymer 4: Weight average molecular weight=118000

Electrically conductive polymer 5: Weight average molecular weight=95000

Electrically conductive polymer 6: Weight average molecular weight=83000

Electrically conductive polymer 7: Weight average molecular weight=109000

Electrically conductive polymer 8: Weight average molecular weight=69000

Electrically conductive polymer 9: Weight average molecular weight=112000

Comparative Examples 1-1 to 1-10

Comparative electrically conductive films 1 to 10 were prepared and evaluated in the same manner as Example 1-1 except that the onium salt compound was changed to dopants shown in Table 2. The results are shown in Table 2.

In addition, in a case of iodine doping in Comparative Examples 1 to 3, film formation was made using only an electrically conductive polymer 1 and a solvent, and a formed film was left to stand for 1 hour in an iodine saturated atmosphere after drying the film. Then, the electrical conductivity was measured after 15 minutes from returning the film into the air atmosphere.

TABLE 1

| | Electrically conductive polymer | Dopant | Electrical conductivity σ (S/cm) | Solubility | Film-forming property | Dopant volatilization |
|---|---|---|---|---|---|---|
| Ex 1-1 | Electrically conductive polymer 1 | Onium salt compound 1 | 0.2 | B | B | No |
| Ex 1-2 | Electrically conductive polymer 1 | Onium salt compound 2 | 1.8 | B | B | No |
| Ex 1-3 | Electrically conductive polymer 1 | Onium salt compound 3 | 0.4 | B | B | No |
| Ex 1-4 | Electrically conductive polymer 1 | Onium salt compound 4 | 0.02 | B | B | No |
| Ex 1-5 | Electrically conductive polymer 1 | Onium salt compound 5 | <0.005 | B | B | No |
| Ex 1-6 | Electrically conductive polymer 1 | Onium salt compound 6 | 0.03 | B | B | No |
| Ex 1-7 | Electrically conductive polymer 1 | Onium salt compound 7 | 4.0 | B | B | No |
| Ex 1-8 | Electrically conductive polymer 1 | Onium salt compound 8 | 1.6 | B | B | No |
| Ex 1-9 | Electrically conductive polymer 1 | Onium salt compound 9 | 0.1 | B | B | No |
| Ex 1-10 | Electrically conductive polymer 1 | Onium salt compound 10 | 0.01 | B | B | No |
| Ex 1-11 | Electrically conductive polymer 1 | Onium salt compound 11 | 0.1 | B | B | No |
| Ex 1-12 | Electrically conductive polymer 2 | Onium salt compound 7 | 7.5 | A | A | No |
| Ex 1-13 | Electrically conductive polymer 3 | Onium salt compound 7 | 0.008 | A | A | No |
| Ex 1-14 | Electrically conductive polymer 4 | Onium salt compound 7 | 0.03 | B | B | No |
| Ex 1-15 | Electrically conductive polymer 5 | Onium salt compound 7 | 0.04 | B | B | No |
| Ex 1-16 | Electrically conductive polymer 6 | Onium salt compound 11 | 0.03 | C | C | No |
| Ex 1-17 | Electrically conductive polymer 7 | Onium salt compound 11 | 0.01 | C | C | No |
| Ex 1-18 | Electrically conductive polymer 8 | Onium salt compound 7 | 0.6 | C | C | No |
| Ex 1-19 | Electrically conductive polymer 8 | Onium salt compound 11 | 0.9 | C | C | No |
| Ex 1-20 | Electrically conductive polymer 9 | Onium salt compound 11 | 0.05 | C | C | No |
| Ex 1-21 | Electrically conductive polymer 2 | Onium salt compound 12 | 6.9 | A | A | No |
| Ex 1-22 | Electrically conductive polymer 1 | Onium salt compound 13 | 0.9 | B | B | No |
| Ex 1-23 | Electrically conductive polymer 2 | Onium salt compound 14 | 1.3 | A | A | No |

"Ex" means Example.

TABLE 2

| | Electrically conductive polymer | Dopant | Electrical conductivity σ (S/cm) | Solubility | Film forming property | Dopant volatilization |
|---|---|---|---|---|---|---|
| C Ex 1-1 | Electrically conductive polymer 1 | TsOH | <0.005 | D | C | No |
| C Ex 1-2 | Electrically conductive polymer 1 | FeCl$_3$ | 0.1 | E | E | No |
| C Ex 1-3 | Electrically conductive polymer 1 | I$_2$ | 0.7 | C | C | Yes |
| C Ex 1-4 | Electrically conductive polymer 1 | H$_2$SO$_4$ | No film formation | E | E | No |

TABLE 2-continued

|  | Electrically conductive polymer | Dopant | Electrical conductivity σ (S/cm) | Solubility | Film forming property | Dopant volatilization |
|---|---|---|---|---|---|---|
| C Ex 1-5 | Electrically conductive polymer 1 | $LiB(C_6F_5)_4$ | <0.005 | D | C | No |
| C Ex 1-6 | Electrically conductive polymer 1 | $NaBPh_4$ | <0.005 | D | C | No |
| C Ex 1-7 | Electrically conductive polymer 1 | $BPh_3$ | <0.005 | C | D | No |
| C Ex 1-8 | Electrically conductive polymer 1 | $B(C_6F_5)_3$ | 0.03 | C | D | No |
| C Ex 1-9 | Electrically conductive polymer 1 | $BF_3$ | <0.005 | C | D | No |
| C Ex 1-10 | Electrically conductive polymer 1 | $HB(C_6F_5)_4$ | 1.2 | C | E | No |

"C Ex" means Comparative Example.

As shown in Table 1, when the onium salt compound was used as the dopant, doping effectively arose, and the electrically conductive films exhibited high electrical conductivity. The electrically conductive compositions used also exhibited good solubility and film-forming property. Moreover, no dopant volatilization was observed, either.

In contrast, as shown in Table 2, the comparative electrically conductive films using conventional dopants were poor in at least one of the solubility and film-forming property. Moreover, dopant volatilization was observed in the comparative electrically conductive film using iodine as the dopant.

Example 1-24

To 100 mg of the above-described electrically conductive polymer 1, 16.5 mL of mixed solvent of xylene/tetrahydrofuran (1:1 in a volume ratio) was added, the polymer was sufficiently dissolved at 60° C. using an ultrasonic water bath, and then 15 mg of the above-described onium salt compound 7 was added thereto and dissolved at room temperature, and thus a mixed solution was prepared. Film formation was made from the resultant solution by spin coating in the same manner as Example 1-1, and then a formed film was irradiated with ultraviolet rays.

The electrical conductivity of this film was measured in the same manner as Example 1-1. The results are shown in Table 3.

Examples 1-25 to 1-27

Electrically conductive films in Examples 1-25 to 1-27 were prepared and evaluated in the same manner as Example 1-24 except that amounts of addition of the onium salt compound was changed to amounts shown in Table 3 below. The results are shown in Table 3. In addition, Table 3 also shows the results in Example 1-7.

TABLE 3

|  | Ex 1-24 | Ex 1-25 | Ex 1-7 | Ex 1-26 | Ex 1-27 |
|---|---|---|---|---|---|
| Electrically conductive polymer 1 (mg) | 100 | 100 | 100 | 100 | 100 |
| Onium salt compound 7 (mg) | 15 | 30 | 65.5 | 2 | 7 |
| Electrical conductivity (S/cm) | 1.9 | 3.2 | 4.0 | <0.01 | 0.2 |

"Ex" means Example.

As shown in Table 3, the films in Examples 1-24, 1-25, and 1-7 in which 10 parts by mass or more of the onium salt compounds were used based on 100 parts by mass of the electrically conductive polymers exhibited higher electrical conductivity in comparison with the films in Examples 1-26 and 1-27 in which less than 10 parts by mass of the onium salt compounds were used.

Comparative Example 1-21

Curable Monomer-Containing Electrically Conductive Compositions

To 80 mg of the above-described electrically conductive polymer 1, and 20 mg of EPICOAT 828 (trade name, manufactured by Japan Epoxy Resins Co., Ltd.) as a curable monomer, 20.5 mL of a chloroform solvent was added, and the resultant mixture was sufficiently dissolved at 60° C. using an ultrasonic water bath. Then, 65.5 mg of the above-described onium salt compound 7 was added thereto and dissolved at room temperature, and thus a mixed solution was prepared. Film formation was made from the resultant solution by spin coating, and a formed film was irradiated with ultraviolet rays in the same manner as Example 1-7.

The electrical conductivity of this film was measured in the same manner as described above. As a result, the electrical conductivity was 0.005 S/cm or less. The value of the electrical conductivity obtained was significantly lower than the value of the electrical conductivity of 4.0 S/cm of the film in Example 1-7 in which the film contains the electrically conductive polymer 1 and the onium salt compound 7, but does not contain any curable monomer.

Further, in Comparative Example 1-21, unevenness on the film surface after irradiation with ultraviolet rays was large, and deterioration of the film-forming property was confirmed.

Example 2-1

To 100 mg of electrically conductive polymer 2-1 having a structure shown below (weight average molecular weight=87,000, manufactured by Aldrich Corporation), 16.5 mL of mixed solvent of xylene (non-dehydrated, manufactured by Wako Pure Chemical Industries, Ltd.)/tetrahydrofuran (non-dehydrated, not containing a stabilizer, manufactured by Wako Pure Chemical Industries, Ltd.) (1:1 in a volume ratio) was added, and the resultant mixture was sufficiently dissolved at 60° C. using an ultrasonic water bath. Then, 65.5 mg of onium salt compound 2-1 having a structure shown below was added thereto and dissolved at room temperature, and thus a mixed solution was prepared. Solubility of the solution prepared was evaluated by the evaluation technique described below.

Subsequently, a glass substrate having a thickness of 1.1 mm and a size of 40 mm×50 mm was subjected to ultrasonic cleaning in acetone, and subjected to UV-ozone treatment for 10 minutes. The mixed solution prepared as described above was applied by spin coating (1,500 rpm, 30 seconds) onto this glass substrate, and then the solvent was distilled off for 2 hours at room temperature and in vacuum, and thus an electrically conductive film having a thickness of about 50 nm was formed. Then, irradiation with ultraviolet rays (amount of light: 1.06 J/cm$^2$) was applied using a UV irradiator (ECS-401GX, manufactured by EYE GRAPHICS Co., Ltd.), and thus an electrically conductive polymer was subjected to doping. The doping of the electrically conductive film was confirmed in the same manner as Example 1-1. With regard to the electrically conductive film obtained, the moisture content was measured by the method described below. Further, the electrical conductivity, film-forming property, and presence or absence of dopant volatilization were evaluated in the same manner as Example 1-1. The results are shown in Table 5.

[Measurement of Moisture Content]

An electrically conductive film obtained was allowed to stand at 25° C. and 60% RH for 6 hours in a thermo-hygrostat and reached equilibrium, and then measurement was carried out according to a Karl-Fischer method by means of a moisture meter and a sample dryer (CA-03 and VA-05, respectively, both manufactured by Mitsubishi Chemical Corporation). The moisture content of the film was calculated by dividing the resulting amount of moisture (g) by sample weight (g).

Examples 2-2 to 2-25

Electrically conductive films were prepared and evaluated in the same manner as Example 2-1 except that kinds of an electrically conductive polymer and an onium salt compound, presence or absence of use of a dehydrated solvent, and time for distilling off of the solvent at room temperature and in vacuum after spin coating were changed as shown in Table 4. When a dehydrated solvent was used, the dehydrated solvent was used as a solvent for dissolving the electrically conductive polymer in place of the solvent used in Example 2-1. As the dehydrated solvent, dehydrated xylene (for organic synthesis use, manufactured by Wako Pure Chemical Industries, Ltd.), and dehydrated tetrahydrofuran (not containing a stabilizer, for organic synthesis use, manufactured by Wako Pure Chemical Industries, Ltd.) were used.

The results are presented in Table 5.

Comparative Examples 2-1 to 2-5

Comparative electrically conductive films 1 to 5 were prepared and evaluated in the same manner as Example 2-1 except that kinds of an electrically conductive polymer and a dopant, presence or absence of use of a dehydrated solvent, and time for distilling off of the solvent at room temperature and in vacuum after spin coating were changed as shown in Table 4. The results are shown in Table 5. In addition, in a case of iodine doping in Comparative Example 2-3, film formation was made from only the electrically conductive polymer 2-1 and the solvent, and a formed film was left to stand in an iodine saturated-atmosphere for 1 hour after drying the film. Then, the electrical conductivity was measured after 15 minutes from returning the film into an air atmosphere.

TABLE 4

|  | Electrically conductive polymer | Dopant | Use of dehydrated solvent | Time for distilling off of the solvent at room temperature and in vacuum |
| --- | --- | --- | --- | --- |
| Ex 2-1 | Electrically conductive polymer 2-1 | Onium salt compound 2-1 | No | 2 hours |
| Ex 2-2 | Electrically conductive polymer 2-1 | Onium salt compound 2-2 | No | 2 hours |
| Ex 2-3 | Electrically conductive polymer 2-1 | Onium salt compound 2-3 | No | 2 hours |
| Ex 2-4 | Electrically conductive polymer 2-1 | Onium salt compound 2-4 | No | 0.5 hours |
| Ex 2-5 | Electrically conductive polymer 2-1 | Onium salt compound 2-5 | No | 1 hour |
| Ex 2-6 | Electrically conductive polymer 2-1 | Onium salt compound 2-6 | Yes | 5 hours |
| Ex 2-7 | Electrically conductive polymer 2-1 | Onium salt compound 2-7 | No | 3 hours |
| Ex 2-8 | Electrically conductive polymer 2-1 | Onium salt compound 2-7 | No | 0.5 hours |
| Ex 2-9 | Electrically conductive polymer 2-1 | Onium salt compound 2-8 | No | 0.5 hours |
| Ex 2-10 | Electrically conductive polymer 2-1 | Onium salt compound 2-9 | No | 2 hours |
| Ex 2-11 | Electrically conductive polymer 2-1 | Onium salt compound 2-10 | No | 2 hours |
| Ex 2-12 | Electrically conductive polymer 2-1 | Onium salt compound 2-11 | No | 2 hours |
| Ex 2-13 | Electrically conductive polymer 2-2 | Onium salt compound 2-7 | No | 2 hours |
| Ex 2-14 | Electrically conductive polymer 2-2 | Onium salt compound 2-7 | Yes | 1 hour |
| Ex 2-15 | Electrically conductive polymer 2-3 | Onium salt compound 2-2 | No | 1 hour |
| Ex 2-16 | Electrically conductive polymer 2-4 | Onium salt compound 2-2 | No | 2 hours |
| Ex 2-17 | Electrically conductive polymer 2-5 | Onium salt compound 2-2 | No | 2 hours |
| Ex 2-18 | Electrically conductive polymer 2-6 | Onium salt compound 2-1 | No | 2 hours |
| Ex 2-19 | Electrically conductive polymer 2-7 | Onium salt compound 2-10 | No | 2 hours |
| Ex 2-20 | Electrically conductive polymer 2-8 | Onium salt compound 2-7 | No | 2 hours |
| Ex 2-21 | Electrically conductive polymer 2-9 | Onium salt compound 2-8 | No | 2 hours |
| Ex 2-22 | Electrically conductive polymer 2-10 | Onium salt compound 2-10 | No | 2 hours |
| Ex 2-23 | Electrically conductive polymer 2-1 | Onium salt compound 2-7 | Yes | 48 hours |
| Ex 2-24 | Electrically conductive polymer 2-2 | Onium salt compound 2-7 | Yes | 48 hours |
| Ex 2-25 | Electrically conductive polymer 2-11 | Onium salt compound 2-7 | No | 5 hours |
| C Ex 2-1 | Electrically conductive polymer 2-1 | TsOH | No | 0.5 hours |
| C Ex 2-2 | Electrically conductive polymer 2-1 | $FeCl_3$ | No | 0.5 hours |
| C Ex 2-3 | Electrically conductive polymer 2-1 | $I_2$ | Yes | 0.5 hours |
| C Ex 2-4 | Electrically conductive polymer 2-1 | $H_2SO_4$ | No | 0.5 hours |
| C Ex 2-5 | Electrically conductive polymer 2-1 | $B(C_6F_5)_3$ | No | 0.5 hours |

"Ex" means Example.
"C Ex" means Comparative Example.

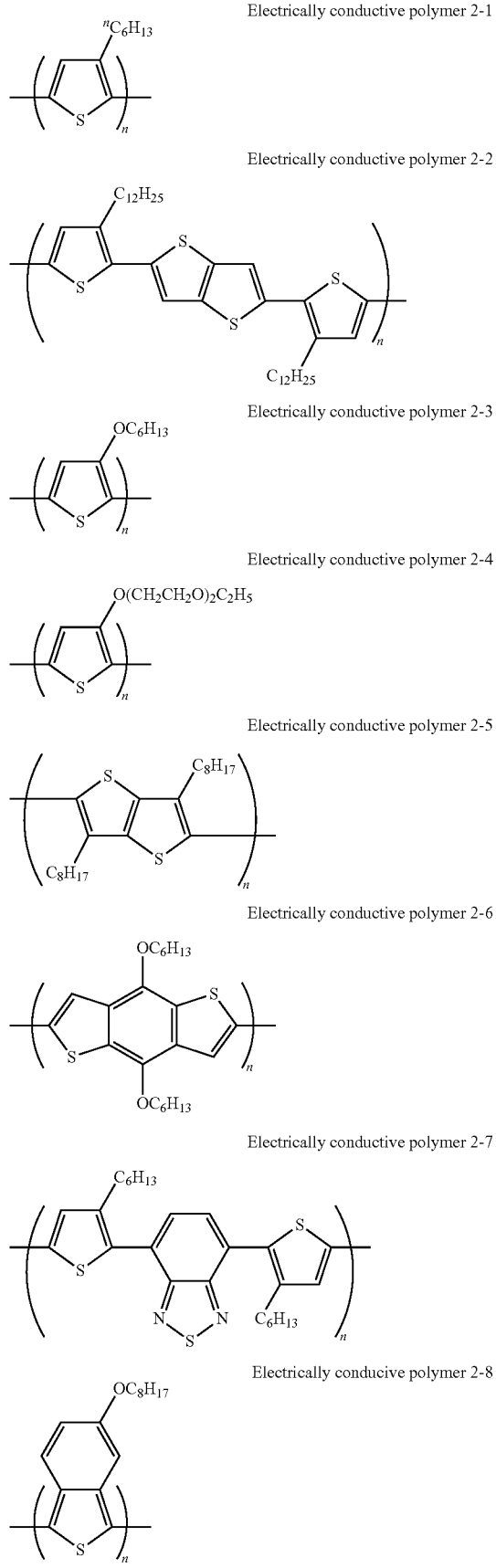
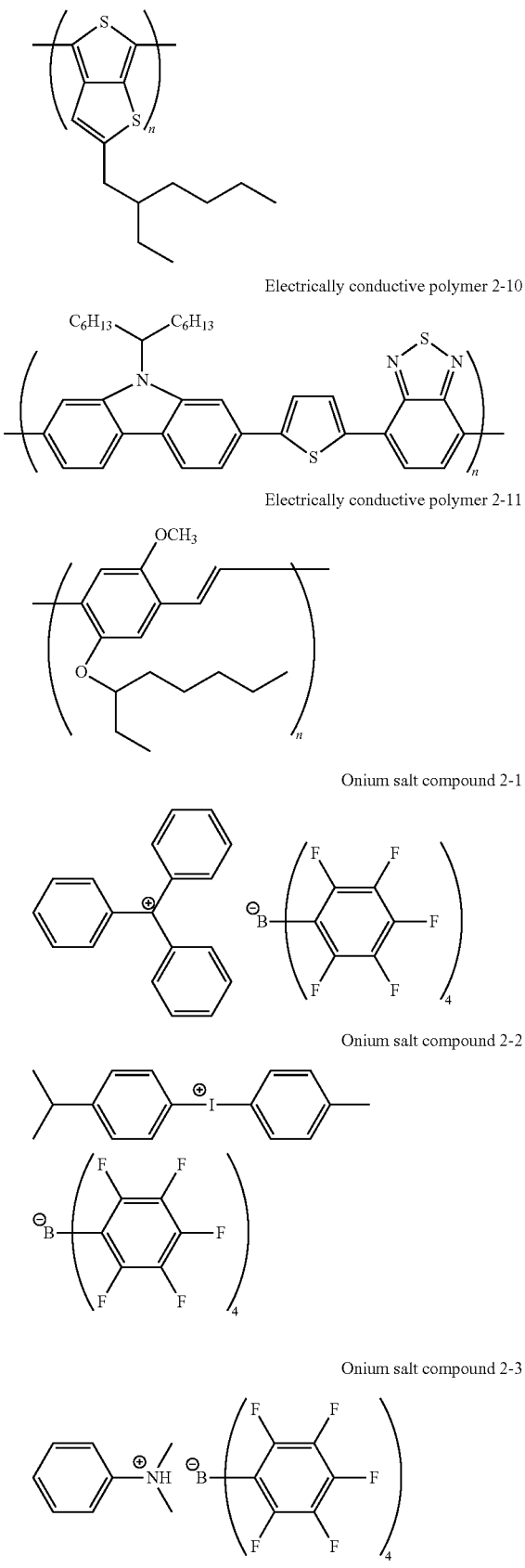

Onium salt compound 2-4

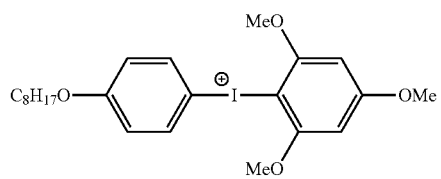

Onium salt compound 2-5

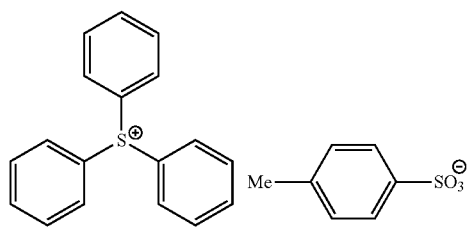

Onium salt compound 2-6

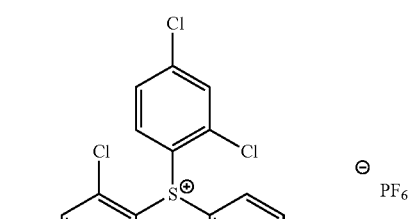

Onium salt compound 2-7

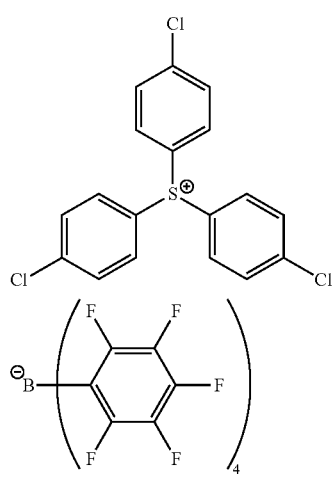

Onium salt compound 2-8

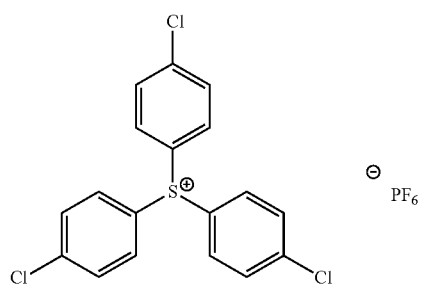

Onium salt compound 2-9

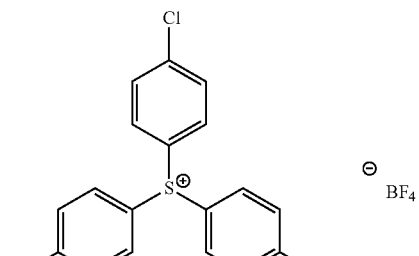

Onium salt compound 2-10

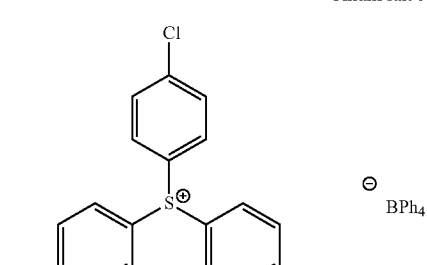

Onium salt compound 2-11

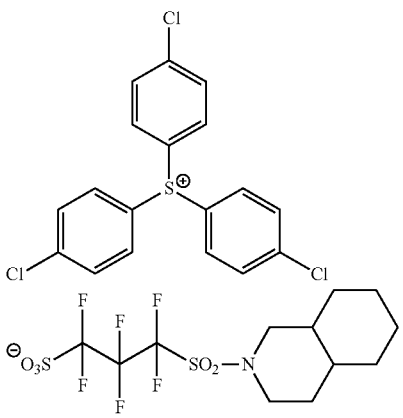

Molecular weight of each of the electrically conductive polymers 2-1 to 2-11 used is as described below.

Electrically conductive polymer 2-1: Weight average molecular weight=87000
Electrically conductive polymer 2-2: Weight average molecular weight=77000
Electrically conductive polymer 2-3: Weight average molecular weight=92000
Electrically conductive polymer 2-4: Weight average molecular weight=24000
Electrically conductive polymer 2-5: Weight average molecular weight=11000
Electrically conductive polymer 2-6: Weight average molecular weight=39000
Electrically conductive polymer 2-7: Weight average molecular weight=17000
Electrically conductive polymer 2-8: Weight average molecular weight=26000
Electrically conductive polymer 2-9: Weight average molecular weight=13000
Electrically conductive polymer 2-10: Weight average molecular weight=11000
Electrically conductive polymer 2-11: Weight average molecular weight=109000

TABLE 5

| | Electrically conductive polymer | Dopant | Moisture content (mass %) | Electrical conductivity σ (S/cm) | Solubility | Film-forming property | Dopant volatilization |
|---|---|---|---|---|---|---|---|
| Ex 2-1 | Electrically conductive polymer 2-1 | Onium salt compound 2-1 | 2 | 3.2 | B | B | No |
| Ex 2-2 | Electrically conductive polymer 2-1 | Onium salt compound 2-2 | 0.6 | 4.1 | B | B | No |
| Ex 2-3 | Electrically conductive polymer 2-1 | Onium salt compound 2-3 | 4 | 3.5 | B | B | No |
| Ex 2-4 | Electrically conductive polymer 2-1 | Onium salt compound 2-4 | 12 | 1.6 | B | B | No |
| Ex 2-5 | Electrically conductive polymer 2-1 | Onium salt compound 2-5 | 5 | 2.5 | B | B | No |
| Ex 2-6 | Electrically conductive polymer 2-1 | Onium salt compound 2-6 | 0.04 | 3.4 | B | B | No |
| Ex 2-7 | Electrically conductive polymer 2-1 | Onium salt compound 2-7 | 0.5 | 4.9 | B | B | No |
| Ex 2-8 | Electrically conductive polymer 2-1 | Onium salt compound 2-7 | 11 | 3.9 | B | B | No |
| Ex 2-9 | Electrically conductive polymer 2-1 | Onium salt compound 2-8 | 9 | 1.6 | B | B | No |
| Ex 2-10 | Electrically conductive polymer 2-1 | Onium salt compound 2-9 | 2 | 1.4 | B | B | No |
| Ex 2-11 | Electrically conductive polymer 2-1 | Onium salt compound 2-10 | 3 | 1.7 | B | B | No |
| Ex 2-12 | Electrically conductive polymer 2-1 | Onium salt compound 2-11 | 0.5 | 2.4 | B | B | No |
| Ex 2-13 | Electrically conductive polymer 2-2 | Onium salt compound 2-7 | 0.9 | 1.6 | A | A | No |
| Ex 2-14 | Electrically conductive polymer 2-2 | Onium salt compound 2-7 | 0.09 | 1.9 | A | A | No |
| Ex 2-15 | Electrically conductive polymer 2-3 | Onium salt compound 2-2 | 5 | 1.7 | B | B | No |
| Ex 2-16 | Electrically conductive polymer 2-4 | Onium salt compound 2-2 | 2 | 2.7 | B | B | No |
| Ex 2-17 | Electrically conductive polymer 2-5 | Onium salt compound 2-2 | 1 | 3.8 | A | A | No |
| Ex 2-18 | Electrically conductive polymer 2-6 | Onium salt compound 2-1 | 0.8 | 3.6 | A | A | No |
| Ex 2-19 | Electrically conductive polymer 2-7 | Onium salt compound 2-10 | 2 | 2.5 | B | B | No |
| Ex 2-20 | Electrically conductive polymer 2-8 | Onium salt compound 2-7 | 1 | 2.8 | B | B | No |
| Ex 2-21 | Electrically conductive polymer 2-9 | Onium salt compound 2-8 | 4 | 1.8 | A | A | No |
| Ex 2-22 | Electrically conductive polymer 2-10 | Onium salt compound 2-10 | 0.7 | 3.7 | B | B | No |
| Ex 2-23 | Electrically conductive polymer 2-1 | Onium salt compound 2-7 | 0.008 | 0.8 | B | B | No |
| Ex 2-24 | Electrically conductive polymer 2-2 | Onium salt compound 2-7 | 0.005 | 0.6 | B | B | No |
| Ex 2-25 | Electrically conductive polymer 2-11 | Onium salt compound 2-7 | 0.6 | 0.01 or less | C | C | No |
| C Ex 2-1 | Electrically conductive polymer 2-1 | TsOH | 9 | <0.005 | D | C | No |
| C Ex 2-2 | Electrically conductive polymer 2-1 | $FeCl_3$ | 10 | 0.1 | E | E | No |
| C Ex 2-3 | Electrically conductive polymer 2-1 | $I_2$ | 0.09 | 0.7 | C | C | Yes |
| C Ex 2-4 | Electrically conductive polymer 2-1 | $H_2SO_4$ | 12 | No film formation | E | E | No |
| C Ex 2-5 | Electrically conductive polymer 2-1 | $B(C_6F_5)_3$ | 4 | 0.03 | C | D | No |

"Ex" means Example.
"C Ex" means Comparative Example.

As shown in Table 5, the electrically conductive films in Examples 2-1 to 2-25 had high electrical conductivity and also good solubility and film-forming property. In particular, the electrically conductive films in Examples 2-1 to 2-22 in which the thiophene-based compound was used as the electrically conductive polymer and the moisture content was within the specified range exhibited very high electrical conductivity of 1.0 S/cm or more.

In contrast, in Comparative Examples 2-1 to 2-5 in which no onium salt compound was used as a dopant, the electrical conductivity was lower, and the solubility and film-forming property were also inferior.

Example 3-1

An electrically conductive film was prepared in the same manner as Example 1-1 except that a 188 μm-thick polyethylenenaphthalate (PEN) film: TEONEX Q51 (manufactured by TEIJIN LTD.) was used as a substrate. The electrically conductive film obtained was evaluated with regard to the electrical conductivity, film-forming property, and presence or absence of dopant volatilization in the same manner as Example 1-1. The results are shown in Table 6.

TABLE 6

| | Electrically conductive polymer | Dopant | Electrical conductivity σ (S/cm) | Film-forming property | Dopant volatilization |
|---|---|---|---|---|---|
| Example 3-1 | Electrically conductive polymer 1 | Onium salt compound 1 | 0.18 | B | No |

As shown in Table 6 even when the resin film was used as the substrate, the electrically conductive film formed using the electrically conductive composition of the present invention exhibited high electrical conductivity and good film-forming property, and had no dopant volatilization.

Example 3-2

An electrically conductive film was prepared the same manner as Example 1-1 except that a 178 μm-thick and indium tin oxide (ITO)-coated polyethylene terephthalate (PET) film (surface electrical resistance: 100 Ω/square, manufactured by Sigma-Aldrich Japan K.K) was used as a substrate. The electrically conductive film obtained was evaluated with regard to the film-forming property, and presence or absence of dopant volatilization in the same manner as Example 1-1. The results are shown in Table 7.

TABLE 7

| | Electrically conductive polymer | Dopant | Film-forming property | Dopant volatilization |
|---|---|---|---|---|
| Example 3-2 | Electrically conductive polymer 1 | Onium salt compound 1 | B | No |

As shown in Table 7, even when the ITO film being an electrically conducting material was used as the substrate, the electrically conductive film formed using the electrically conductive composition of the present invention exhibited good film-forming property, and had no dopant volatilization.

Example 3-3

On both ends of an electrically conductive film prepared in the same manner as Example 1-2, 2 mm-wide gold electrodes were formed by a vacuum deposition process. When one side of a glass substrate was heated by means of a dryer, and measurement was carried out using a tester, a voltage difference was generated depending on a temperature difference between the gold electrodes. Thus, the electrically conductive film prepared using the electrically conductive composition of the present invention was confirmed to operate as a thermoelectric conversion element.

Example 3-4

Doping by Heat

An electrically conductive film was prepared and evaluated in the same manner as Example 1-7 except that doping steps after film formation were changed to heating at 180° C. for 30 minutes from irradiation with ultraviolet rays. The results are shown in Table 8.

TABLE 8

| | Method of doping | Electrical conductivity σ(S/cm) | Film-forming property | Dopanta volatilization |
|---|---|---|---|---|
| Example 3-4 | Heat | 1.4 | B | No |

As shown in Table 8, the electrically conductive film in Example 3-4 was subjected to doping by heating, and exhibited high electrical conductivity and good film-forming property, and had no dopant volatilization.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2011-070392 filed in Japan on Mar. 28, 2011 and Patent Application No. 2011-105912 filed in Japan on May 11, 2011, which are entirely herein incorporated by reference.

The invention claimed is:

1. An electrically conductive composition, comprising an electrically conductive polymer, and an onium salt compound as a dopant to the electrically conductive polymer, wherein the moisture content of the electrically conductive composition is 0.01% by mass or more to 15% by mass or less, the electrically conductive composition comprises the onium salt compound in an amount of 10 parts by mass or more based on 100 parts by mass of the electrically conductive polymer, the onium salt compound is at least one compound selected from compounds represented by Formulae (I) to (V),

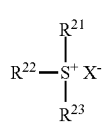

Formula (I)

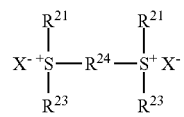

Formula (II)

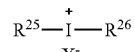

Formula (III)

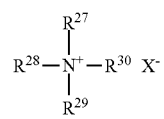

Formula (IV)

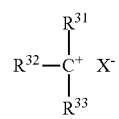

Formula (V)

wherein in Formulae (I) to (V), $R^{21}$ to $R^{23}$, $R^{25}$ to $R^{26}$, and $R^{31}$ to $R^{33}$ each independently represent an alkyl group, an aralkyl group, an aryl group, or an aromatic heterocyclic group; $R^{27}$ to $R^{30}$ each independently represent a hydrogen atom, an alkyl group, an aralkyl group, an aryl group, an aromatic heterocyclic group, an alkoxy group, or an aryloxy group; $R^{24}$ represents an alkylene group or an arylene group; $X^-$ represents an anion of strong acid; and two of arbitrary groups selected from $R^{21}$ to $R^{23}$, $R^{25}$ to $R^{26}$, and $R^{31}$ to $R^{33}$ in an identical formula may be bonded with each other to form an aliphatic ring, an aromatic ring, or a heterocyclic ring, and the electrically conductive polymer is a conjugated polymer having at least a repeating unit derived from a thiophene compound.

2. The electrically conductive composition according to claim 1, wherein the electrically conductive polymer and the onium salt compound are uniformly dispersed in the composition.

3. The electrically conductive composition according to claim 1, wherein the onium salt compound is a compound that generates acid by provision of heat or irradiation with active energy rays.

4. The electrically conductive composition according to claim 1, wherein the onium salt compound is a sulfonium salt compound represented by Formula (I) and/or (II), $R^{21}$ to $R^{23}$ are a phenyl group, or a chlorine-substituted phenyl group, and $X^-$ is an anion of alkyl or aryl borate.

5. The electrically conductive composition according to claim 1, wherein the electrically conductive polymer has at least one repeating unit selected from repeating units represented by Formulae (1) to (5),

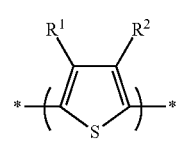

(1)

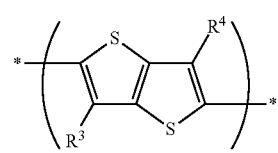

(2)

-continued

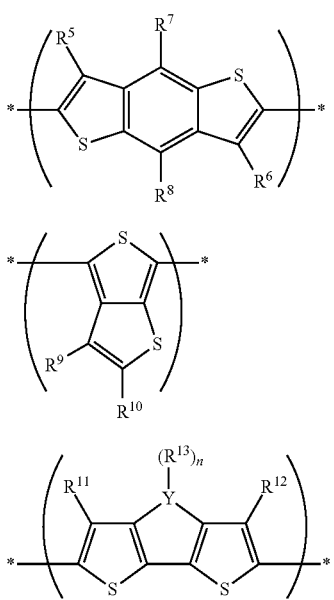

wherein in Formulae (1) to (5), $R^1$ to $R^{13}$ each independently represent a hydrogen atom, a halogen atom, an alkyl group, an alkoxy group, a perfluoroalkyl group, a perfluoroalkoxy group, an amino group, an alkylthio group, a polyalkyleneoxy group, an acyloxy group, or an alkyloxycarbonyl group; Y represents a carbon atom, a nitrogen atom, or a silicon atom; and n represents an integer of 1 or 2.

6. The electrically conductive composition according to claim 1, further comprising a solvent.

7. An electrically conductive film, formed by shaping the electrically conductive composition according to claim 1, and then providing the shaped product with heat or active energy rays.

8. An electrically conductive laminate, formed by coating the electrically conductive composition according to claim 1 onto a substrate, and then providing the coated product with heat or active energy rays.

9. The electrically conductive laminate according to claim 8, wherein the substrate is a resin film.

10. The electrically conductive laminate according to claim 8, further having an electrode.

11. The electrically conductive composition according to claim 1, wherein the moisture content of the electrically conductive composition is 0.05% by mass or more toll % by mass or less.

12. An electrically conductive article, using the electrically conductive composition according to claim 1, comprising an electrically conductive film, formed by shaping the electrically conductive composition, and then providing the shaped product with heat or active energy rays; and comprising an electrically conductive laminate, formed by coating the electrically conductive composition onto a substrate, and then providing the coated product with heat or active energy rays.

13. A method of producing an electrically conductive film, comprising a step of shaping the electrically conductive composition according to claim 1, and a step of heating the shaped product or irradiating the shaped product with active energy rays.

14. The method of producing an electrically conductive composition according to claim 13, further comprising a step of treating the shaped product so as to have the moisture content in an amount of 0.01% by mass or more to 15% by mass or less.

15. The method of producing an electrically conductive film according to claim 13, wherein the shaping step is a step of coating the electrically conductive composition onto a substrate.

* * * * *